United States Patent
Shiratani

(10) Patent No.: US 11,796,912 B2
(45) Date of Patent: Oct. 24, 2023

(54) RADIATION-SENSITIVE COMPOSITION AND PATTERN-FORMING METHOD

(71) Applicant: JSR CORPORATION, Tokyo (JP)

(72) Inventor: Motohiro Shiratani, Tokyo (JP)

(73) Assignee: JSR CORPORATION, Tokyo (JP)

( * ) Notice: Subject to any disclaimer, the term of this patent is extended or adjusted under 35 U.S.C. 154(b) by 863 days.

(21) Appl. No.: 16/287,228

(22) Filed: Feb. 27, 2019

(65) Prior Publication Data

US 2019/0227432 A1 Jul. 25, 2019

Related U.S. Application Data

(63) Continuation of application No. PCT/JP2017/031011, filed on Aug. 29, 2017.

(30) Foreign Application Priority Data

Aug. 29, 2016 (JP) .................................. 2016-166811

(51) Int. Cl.
| | | |
|---|---|---|
| G03F 7/004 | (2006.01) | |
| G03F 7/32 | (2006.01) | |
| G03F 7/16 | (2006.01) | |
| G03F 7/20 | (2006.01) | |

(52) U.S. Cl.
CPC .......... G03F 7/0043 (2013.01); G03F 7/0042 (2013.01); G03F 7/0045 (2013.01); G03F 7/162 (2013.01); G03F 7/168 (2013.01); G03F 7/2004 (2013.01); G03F 7/2037 (2013.01); G03F 7/322 (2013.01); G03F 7/325 (2013.01)

(58) Field of Classification Search
CPC ..... G03F 7/0043; G03F 7/0042; G03F 7/0044
See application file for complete search history.

(56) References Cited

U.S. PATENT DOCUMENTS

| | | | |
|---|---|---|---|
| 6,136,500 A | 10/2000 | Kobayashi et al. | |
| 6,136,501 A | 10/2000 | Trefonas, III et al. | |
| 2015/0234272 A1* | 8/2015 | Sarma .................. | G03F 7/0392 430/281.1 |
| 2016/0231652 A1* | 8/2016 | Hatakeyama ......... | G03F 7/2059 |
| 2017/0269476 A1 | 9/2017 | Nakagawa et al. | |
| 2017/0299962 A1 | 10/2017 | Shiratani et al. | |

FOREIGN PATENT DOCUMENTS

| | | | | |
|---|---|---|---|---|
| JP | 8-146610 A | 6/1996 | | |
| JP | 11-125907 A | 5/1999 | | |
| JP | 2000-298347 A | 10/2000 | | |
| JP | 2001-92116 A | 4/2001 | | |
| JP | 2001092116 A | * | 4/2001 | |
| JP | 2009-134088 A | 6/2009 | | |
| WO | WO-2015125554 A1 | * | 8/2015 | ........... G03F 7/0397 |
| WO | WO 2016/088655 A1 | 6/2016 | | |
| WO | WO 2016/111300 A1 | 7/2016 | | |

OTHER PUBLICATIONS

Safety Data Sheet: Nitric Acid. Aug. 13, 2016, Fertiberia, p. 8 (Year: 2016).*
Rakita, Philip; Triflic Acid and Its Derivatives; Mar. 2004; Chemistry Today; Mar./Apr. 2004; p. 48 (Year: 2004).*
English Machine Translation of JP2001092116A (Year: 2001).*
English Machine Translation of WO2015125554A1 (Year: 2015).*
Support Document for Identification of Perfluorobutane Sulfonic Acid. Dec. 11, 2019, European Chemicals Agency, p. 26 (Year: 2019).*
International Search Report and Written Opinion dated Oct. 31, 2017 in PCT/JP2017/031011 (with English Translation), 18 pages.
Notice of Reasons for Refusal dated Feb. 16, 2021 in Japanese Patent Application No. 2018-537306 (with English machine translation), 6 pages.

* cited by examiner

*Primary Examiner* — Duane Smith
*Assistant Examiner* — Nicholas E Brown
(74) *Attorney, Agent, or Firm* — Oblon, McClelland, Maier & Neustadt, L.L.P.

(57) ABSTRACT

A radiation-sensitive composition contains: particles that include a metal oxide, a cation that includes a metal, an anion. The anion is preferably a conjugated base of an acid and the acid has preferably a pKa of no greater than 3. The content of the particles in terms of solid content equivalent is preferably no less than 50% by mass, and more preferably no less than 70% by mass. The hydrodynamic radius of the particles as determined by a dynamic light scattering analysis is preferably no greater than 10 nm. The total content of the cation and the anion with respect to 100 parts by mass of the particles is preferably no less than 5 parts by mass. The acid is preferably sulfonic acid, nitric acid, organic azinic acid, disulfonylimidic acid or a combination thereof.

20 Claims, No Drawings

RADIATION-SENSITIVE COMPOSITION AND PATTERN-FORMING METHOD

CROSS-REFERENCE TO RELATED APPLICATIONS

The present application is a continuation application of International Application No. PCT/JP2017/031011, filed Aug. 29, 2017, which claims priority to Japanese Patent Application No. 2016-166811, filed Aug. 29, 2016. The contents of these applications are incorporated herein by reference in their entirety.

BACKGROUND OF THE INVENTION

Field of the Invention

The present invention relates to a radiation-sensitive composition and a pattern-forming method.

Discussion of the Background

A radiation-sensitive composition for use in microfabrication by lithography generates an acid at a light-exposed region upon irradiation with an electromagnetic wave such as a far ultraviolet ray (e.g., ArF excimer laser beam, KrF excimer laser beam, etc.) or an extreme ultraviolet ray (EUV), a charged particle ray such as an electron beam. A chemical reaction in which the acid serves as a catalyst causes the difference in rates of dissolution in a developer solution, between light-exposed regions and light-unexposed regions to form a pattern on a substrate.

Such radiation-sensitive compositions are demanded to have improved resist performances along with miniaturization in processing techniques. To meet such demands, types, molecular structures and the like of polymers, acid generating agents and other components which may be used in the compositions have been investigated, and combinations thereof have been further investigated in detail (see, Japanese Unexamined Patent Application, Publication Nos. H11-125907, H8-146610 and 2000-298347).

SUMMARY OF THE INVENTION

According to an aspect of the present invention, a radiation-sensitive composition contains: particles that include a metal oxide, a cation that includes a metal, an anion.

According to another aspect of the present invention, a pattern-forming method includes applying the radiation-sensitive composition directly or indirectly on an upper face side of a substrate to provide a film. The film provided by the applying of the radiation-sensitive composition is exposed. The film exposed is developed.

DESCRIPTION OF THE EMBODIMENTS

According to an embodiment of the invention, a radiation-sensitive composition comprises: particles (hereinafter, may be also referred to as "(A) particles" or "particles (A)") comprising a metal oxide; a cation (hereinafter, may be also referred to as "(B) cation" of "cation (B)") comprising a metal; and an anion (hereinafter, may be also referred to as "(C) anion" or "anion (C)").

According to another embodiment of the invention, a pattern-forming method comprises: applying the radiation-sensitive composition according to the embodiment of the present invention directly or indirectly on an upper face side of a substrate; exposing a film provided by the applying; and developing the film exposed.

According to the radiation-sensitive composition and the pattern-forming method of the embodiments of the present invention, formation of a pattern accompanied by less LWR (Line Width Roughness) is enabled with superior sensitivity particularly to exposure light such as an electron beam or EUV. Therefore, these can be suitably used in manufacture of semiconductor devices in which further progress of miniaturization is expected in the future. Hereinafter, the embodiments of the present invention will be described in detail.

Radiation-Sensitive Composition

The radiation-sensitive composition contains the particles (A), the cation (B) and the anion (C). The anion (C) is preferably a conjugated base of an acid (hereinafter, may be also referred to as "acid (I)"), and the acid (I) preferably has a pKa of no greater than 3. The radiation-sensitive composition may also contain (D) a carboxylic acid and/or (E) a solvent as a favorable component, and within a range not leading to impairment of the effects of the present invention, may also contain other optional component(s).

Due to containing the particles (A), the cation (B) and the anion (C), the radiation-sensitive composition is superior in the LWR performance and sensitivity. Although not necessarily clarified and without wishing to be bound by any theory, the reason for achieving the effects described above due to the radiation-sensitive composition having the aforementioned constitution is inferred as in the following, for example. Specifically, it is considered that the exposure light acts on the metal atom of the cation (B) and the like to generate a secondary electron, and an action of the secondary electron results in generation of the acid (I) from the anion (C). This acid (I) is coordinated through substitution to a substance having been coordinated to the metal of the particles (A), leading to a change in a solubility of the particles (A) into a developer solution, and the pattern is formed accordingly. In this instance, due to the anion (C) being a conjugated base of the acid (I) having a pKa of no greater than 3, as well as to comparatively week coordination force to the metal atom of the particles (A), and the like, occurrence of aggregation etc., of the particles (A) is adequately inhibited, whereby minimization of LWR of the pattern would be enabled, and an improvement of the sensitivity of the pattern would be enabled. Each component will be described below.

(A) Particles

The particles (A) include a metal oxide. The term "metal oxide" as referred to herein means a compound including a metal atom and an oxygen atom. Since the particles (A) include a metal oxide, the change of the substance bonding to the metal atom of the particles (A) enables the solubility thereof in a developer solution to be altered, thereby enabling the pattern to be formed. In addition, due to including the metal oxide, the particles (A) are capable of generating secondary electrons through absorbing the radioactive ray, and the action of the secondary electron promotes generation of the acid from the anion (C), etc., as described later.

The lower limit of the mean particle diameter of the particles (A) is preferably 0.5 nm, and more preferably 0.8 nm. Meanwhile, the upper limit of the mean particle diameter is preferably 20 nm, more preferably 10 nm, still more preferably 3.0 nm, and particularly preferably 2.5 nm. When the mean particle diameter of the particles (A) falls within the above range, more effective promotion of the generation of the secondary electrons by the particles (A), and consequently more improvements of the LWR performance and the sensitivity of the radiation-sensitive composition are enabled. The term "mean particle diameter" as referred to herein means a harmonic mean particle diameter on the basis of scattered light intensity, as measured by DLS (Dynamic Light Scattering) using a light scattering measurement device.

Metal Oxide

The metal atom of the metal oxide included in the particles (A) is exemplified by metal atoms from groups 3 to 6, and the like.

Examples of the metal atoms from group 3 include a scandium atom, an yttrium atom, a lanthanum atom, a cerium atom and the like.

Examples of the metal atoms from group 4 include a titanium atom, a zirconium atom, a hafnium atom and the like.

Examples of the metal atoms from group 5 include a vanadium atom, a niobium atom, a tantalum atom and the like.

Examples of the metal atoms from group 6 include a chromium atom, a molybdenum atom, a tungsten atom and the like.

Examples of the metal atoms from group 7 include a manganese atom, a rhenium 3.0 atom and the like.

Examples of the metal atoms from group 8 include an iron atom, a ruthenium atom, an osmium atom and the like.

Examples of the metal atoms from group 9 include a cobalt atom, a rhodium atom, an iridium atom and the like.

Examples of the metal atoms from group 10 include a nickel atom, a palladium atom, a platinum atom and the like.

Examples of the metal atoms from group 11 include a copper atom, a silver atom, a gold atom and the like.

Examples of the metal atoms from group 12 include a zinc atom, a cadmium atom, a mercury atom and the like.

Examples of the metal atoms from group 13 include an aluminum atom, a gallium atom, an indium atom and the like.

Examples of the metal atoms from group 14 include a germanium atom, a tin atom, a lead atom and the like.

Examples of the metal atoms from group 15 include an antimony atom, a bismuth atom and the like.

Examples of the metal atoms from group 16 include a tellurium atom and the like.

The metal atom is preferably the metal atom from groups 3 to 14, more preferably the metal atom from group 4, group 5, group 6 and group 14, and still more preferably a titanium atom, a zirconium atom, a hafnium atom, a tantalum atom, a tungsten atom, a tin atom or a combination thereof.

The metal oxide may contain an additional atom, other than the metal atom and an oxygen atom. Examples of the additional atom include metalloid atoms such as a boron atom; a carbon atom; a hydrogen atom; a nitrogen atom; a phosphorus atom; a sulfur atom; a halogen atom; and the like. In the case of the metal oxide including the metalloid atom, the percentage content (% by mass) of the metalloid atom in the metal oxide is typically less than the percentage content of the metal atom.

The lower limit of a total percentage content of the metal atom and the oxygen atom in the metal oxide is preferably 30% by mass, more preferably 50% by mass, still more preferably 70% by mass, and particularly preferably 90% by mass. Meanwhile, the upper limit of the total percentage content is preferably 99.9% by mass. When the total percentage content of the metal atom and the oxygen atom falls within the above range, a more effective promotion of the generation of the secondary electrons by the particles (A), and in turn a more improvement of the sensitivity of the radiation-sensitive composition of the present embodiment are enabled. It is to be noted that the total percentage content of the metal atom and the oxygen atom may be 100% by mass.

A component other than the metal atoms constituting the metal oxide is preferably an organic acid (hereinafter, may be also referred to as "organic acid (a)"). The "organic acid" as referred to herein means an acidic organic compound, and the "organic compound" as referred to means a compound having at least one carbon atom.

When the particles (A) contain the metal oxide constituted from the metal atom and the organic acid (a), more improvements of the LWR performance and the sensitivity of the radiation-sensitive composition of the present embodiment are achieved. The improvements are considered to result from, for example, the organic acid (a) being present in the vicinity of surfaces of the particles (A) due to an interaction with the metal atom is believed to improve dispersibility of the particles (A) in the solvent.

The lower limit of pKa of the organic acid (a) is preferably 0, more preferably 1, still more preferably 1.5, and particularly preferably 3. Meanwhile, the upper limit of the pKa is preferably 7, more preferably 6, still more preferably 5.5, and particularly preferably 5. When the pKa of the organic acid (a) falls within the above range, it is possible to adjust the interaction with the metal atom to be moderately weak, whereby more improvements of the LWR performance and the sensitivity of the radiation-sensitive composition are enabled. As used herein, in the case of the organic acid (a) being a polyvalent acid, the pKa of the organic acid (a) as referred to means a primary acid dissociation constant, i.e., a logarithmic value of a dissociation constant for dissociation of the first proton.

The organic acid (a) may be either a low molecular weight compound or a high molecular weight compound, and a low molecular weight compound is preferred in light of adjusting the interaction with the metal atom to be more appropriately weak. The "low molecular weight compound" as referred to means a compound having a molecular weight of no greater than 1,500, whereby the "high molecular weight compound" as referred to means a compound having a molecular weight of greater than 1,500. The lower limit of the molecular weight of the organic acid (a) is preferably 50, and more preferably 80. Meanwhile, the upper limit of the molecular weight is preferably 1,000, more preferably 500, further more preferably 400, and particularly preferably 300. When the molecular weight of the organic acid (a) falls within the above range, it is possible to adjust the dispersibility of the particles (A) to be more appropriate, and consequently more improvements of the LWR performance and the sensitivity of the radiation-sensitive composition of the present embodiment are enabled.

The organic acid (a) is exemplified by a carboxylic acid, a sulfonic acid, a sulfinic acid, an organic phosphinic acid, an organic phosphonic acid, a phenol, an enol, a thiol, an acid imide, an oxime, a sulfonamide, and the like.

Examples of the carboxylic acid include:

monocarboxylic acids such as formic acid, acetic acid, propionic acid, butanoic acid, pentanoic acid, hexanoic acid, heptanoic acid, octanoic acid, nonanoic acid, decanoic acid, 2-ethylhexanoic acid, oleic acid, acrylic acid, methacrylic acid, trans-2,3-dimethylacrylic acid, stearic acid, linoleic acid, linolenic acid, arachidonic acid, salicylic acid, benzoic acid, p-aminobenzoic acid, monochloroacetic acid, dichloroacetic acid, trichloroacetic acid, trifluoroacetic acid, pentafluoropropionic acid, gallic acid and shikimic acid;

dicarboxylic acids such as oxalic acid, malonic acid, maleic acid, methylmalonic acid, fumaric acid, adipic acid, sebacic acid, phthalic acid and tartaric acid;

carboxylic acids having no less than 3 carboxy groups such as citric acid; and the like.

Examples of the sulfonic acid include benzenesulfonic acid, p-toluenesulfonic acid, and the like.

Examples of the sulfinic acid include benzenesulfinic acid, p-toluenesulfinic acid, and the like.

Examples of the organic phosphinic acid include diethylphosphinic acid, methylphenylphosphinic acid, diphenylphosphinic acid, and the like.

Examples of the organic phosphonic acid include methylphosphonic acid, ethylphosphonic acid, t-butylphosphonic acid, cyclohexylphosphonic acid, phenylphosphonic acid, and the like.

Examples of the phenol include: monovalent phenols such as phenol, cresol, 2,6-xylenol and naphthol;

divalent phenols such as catechol, resorcinol, hydroquinone and 1,2-naphthalenediol;

phenols having a valency of no less than 3 such as pyrogallol and 2,3,6-naphthalenetriol; and the like.

Examples of the enol include 2-hydroxy-3-methyl-2-butene, 3-hydroxy-4-methyl-3-hexene, and the like.

Examples of the thiol include mercaptoethanol, mercaptopropanol, and the like.

Examples of the acid imide include:

carboxylic imides such as maleimide and succinimide;

sulfonic imides such as a di(trifluoromethanesulfonic acid) imide and di(pentafluoroethanesulfonic acid) imide; and the like.

Examples of the oxime include:

aldoximes such as benzaldoxime and salicylaldoxime;

ketoximes such as diethylketoxime, methylethylketoxime and cyclohexanoneoxime; and the like.

Examples of the sulfonamide include methylsulfonamide, ethylsulfonamide, benzenesulfonamide, toluenesulfonamide, and the like.

In light of more improvements of the LWR performance and the sensitivity of the radiation-sensitive composition, as the organic acid (a), the carboxylic acid is preferred; the monocarboxylic acid is more preferred; and methacrylic acid and benzoic acid are still more preferred.

The metal oxide is preferably a metal oxide constituted from the metal atom and the organic acid (a), more preferably a metal oxide constituted from the organic acid (a) and a metal atom from group 4, group 5, group 6 and/or group 14, and still more preferably a metal oxide constituted from: a titanium atom, a zirconium atom, a hafnium atom, a tantalum atom, a tungsten atom or a tin atom; and methacrylic acid or benzoic acid.

The lower limit of a percentage content of the metal oxide in the particles (A) is preferably 60% by mass, more preferably 80% by mass, and still more preferably 95% by mass. It is to be noted that the percentage content of the metal oxide may be 100% by mass. When the percentage content of the metal oxide falls within the above range, more improvements of the LWR performance and the sensitivity of the radiation-sensitive composition are enabled. The particles (A) may include either only one type, or two or more types of the metal oxide.

In the case in which the particles (A) contain as the principal component, the metal oxide, which is constituted from the metal atom and the organic acid, the lower limit of a percentage content of the organic acid (a) in the particles (A) is preferably 1% by mass, more preferably 5% by mass, and still more preferably 10% by mass. Meanwhile, the upper limit of the percentage content is preferably 90% by mass, more preferably 70% by mass, and still more preferably 50% by mass. When the percentage content of the organic acid (a) falls within the above range, it is possible to adjust the dispersibility of the particles (A) to be further appropriate, and consequently more improvements of the LWR performance and the sensitivity of the radiation-sensitive composition of the present embodiment are enabled. The particles (A) may include either only one type, or two or more types of the organic acid (a).

The lower limit of the content of the content of the particles (A) with respect to the total solid content is preferably 50% by mass; more preferably 70% by mass, and still more preferably 90% by mass. The upper limit of the content is preferably 99% by mass, and more preferably 95% by mass. When the content of the particles (A) falls within the above range, more improvements of the LWR performance and the sensitivity of the radiation-sensitive composition of the present embodiment are enabled. The term "total solid content" as referred to herein means the sum of components other than the solvent (E) in the radiation-sensitive composition. The radiation-sensitive composition may include either only one type, or two or more types of the particles (A).

Synthesis Procedure of (A) Particles

The particles (A) may be synthesized by, for example, a procedure of carrying out a hydrolytic condensation reaction by using (b) a metal-containing compound, a procedure of carrying out a ligand substitution reaction by using the metal-containing compound (b), or the like. The "hydrolytic condensation reaction" as referred to herein means a reaction in which a hydrolyzable group included in the metal-containing compound (b) is hydrolyzed to give —OH, and two —OHs thus obtained undergo dehydrative condensation to form —O—.

(b) Metal-Containing Compound

The metal-containing compound (b) may be: a metal compound (I) having a hydrolyzable group; a hydrolysis product of the metal compound (I) having a hydrolyzable group; a hydrolytic condensation product of the metal compound (I) having a hydrolyzable group; or a combination thereof. The metal compound (I) may be used either alone of one type, or in combination of two or more types thereof.

The hydrolyzable group is exemplified by a halogen atom, an alkoxy group, an acyloxy group, and the like.

Examples of the halogen atom include a fluorine atom, a chlorine atom, a bromine atom, an iodine, atom and the like.

Examples of the alkoxy group include a methoxy group, an ethoxy group, a n-propoxy group, an i-propoxy group, a butoxy group, and the like.

Examples of the acyloxy group include an acetoxy group, an ethylyloxy group, a propionyloxy group, a butyryloxy group, a t-butyryloxy group, a t-amylyloxy group, a n-hexanecarbonyloxy group, a n-octanecarbonyloxy group and the like.

As the hydrolyzable group, an alkoxy group and an acyloxy group are preferred, and an isopropoxy group, a butoxy group and an acetoxy group are more preferred.

In a case in which the metal-containing compound (b) is a hydrolytic condensation product of the metal compound (I), the hydrolytic condensation product of the metal compound (I) may be a hydrolytic condensation product of the metal (I) having a hydrolyzable group with a compound including a metalloid atom, within a range not leading to impairment of the effects of the embodiments of the present invention. In other words, the hydrolytic condensation product of the metal compound (I) may also include a metalloid atom within a range not leading to impairment of the effects of the embodiments of the present invention. The metalloid atom is exemplified by a boron atom and the like. The percentage content of the metalloid atom in the hydrolytic condensation product of the metal compound (I) is typically less than 50 atom % with respect to the entirety of the metal atom and the metalloid atom in the hydrolytic condensation product. The upper limit of the percentage content of the metalloid atom is preferably 30 atom % and more preferably 10 atom % with respect to the entirety of the metal atom and the metalloid atom in the hydrolytic condensation product.

The metal compound (I) is exemplified by compounds represented by the following formula (1) (hereinafter, may be also referred to as a "metal compound (I-1)"), and the like. By using the metal compound (I-1), forming a stable metal oxide is enabled, whereby more improvements of the LWR performance and the sensitivity of the radiation-sensitive composition (I) are enabled.

[L$_a$QX$_b$]     (A)

In the above formula (A), Q represents the metal atom; L represents a ligand; a is an integer of 0 to 2, wherein in a case where a is 2, a plurality of Ls may be identical or different; X represents the hydrolyzable group selected from a halogen atom, an alkoxy group and an acyloxy group; and b is an integer of 2 to 6, wherein a plurality of Xs may be identical or different, and L is a ligand that does not fall under the definition of X.

The metal atom represented by Q is exemplified by metal atoms similar to those exemplified in connection with the metal atoms which may constitute the metal oxide included in the particles (A), and the like.

The ligand represented by L is exemplified by a monodentate ligand and a polydentate ligand.

Exemplary monodentate ligand includes a hydroxo ligand, a carboxy ligand, an amide ligand, an ammonia ligand and the like.

Examples of the amido ligand include an unsubstituted amido ligand (NH$_2$), a methylamido ligand (NHMe), a dimethylamido ligand (NMe$_2$), a diethylamido ligand (NEt$_2$), a dipropylamido ligand (NPr$_2$), and the like.

Exemplary polydentate ligand includes a hydroxy acid ester, a β-diketone, a β-keto ester, a β-dicarboxylic acid ester, a hydrocarbon having a π bond, a diphosphine, and the like.

Examples of the hydroxy acid ester include glycolic acid esters, lactic acid esters, 2-hydroxycyclohexane-1-carboxylic acid esters, salicylic acid esters, and the like.

Examples of the β-diketone include 2,4-pentanedione, 3-methyl-2,4-pentanedione, 3-ethyl-2,4-pentanedione, and the like.

Examples of the β-keto ester include acetoacetic acid esters, α-alkyl-substituted acetoacetic acid esters, β-keto-pentanoic acid esters, benzoylacetic acid esters, 1,3-acetonedicarboxylic acid esters, and the like.

Examples of the β-dicarboxylic acid ester include malonic acid diesters, α-alkyl-substituted malonic acid diesters, α-cycloalkyl-substituted malonic acid diesters, α-aryl-substituted malonic acid diesters, and the like.

Examples of the hydrocarbon having a π bond include:
chain olefins such as ethylene and propylene;
cyclic olefins such as cyclopentene, cyclohexene and norbornene;
chain dienes such as butadiene and isoprene;
cyclic dienes such as cyclopentadiene, methylcyclopentadiene, pentamethylcyclopentadiene, cyclohexadiene and norbornadiene;
aromatic hydrocarbons such as benzene, toluene, xylene, hexamethylbenzene, naphthalene and indene; and the like.

Examples of the diphosphine include 1,1-bis(diphenylphosphino)methane, 1,2-bis(diphenylphosphino)ethane, 1,3-bis(diphenylphosphino)propane, 2,2'-bis(diphenylphosphino)-1,1'-binaphthyl, 1,1'-bis(diphenylphosphino)ferrocene, and the like.

It is preferred that "a" is less than "b".

Examples of the halogen atom which may be represented by X include a fluorine atom, a chlorine atom, a bromine atom, an iodine atom, and the like.

Examples of the alkoxy group which may be represented by X include a methoxy group, an ethoxy group, a propoxy group, a butoxy group, and the like.

Examples of the acyloxy group which may be represented by X include an acetoxy group, an ethylyloxy group, a butyryloxy group, a t-butyryloxy group, a t-amyIyloxy group, a n-hexanecarbonyloxy group, a n-octanecarbonyloxy group, and the like.

X represents preferably an alkoxy group or an acyloxy group, and more preferably an isopropoxy group, a butoxy group or an acetoxy group.

Preferably, b is 3 or 4, and more preferably 4. When b is the above specified value, it is possible to increase the percentage content of the metal oxide in the particles (A), whereby more effective promotion of the generation of the secondary electrons by the particles (A) is enabled. Consequently, a more improvement of the sensitivity of the radiation-sensitive composition is enabled.

As the metal-containing compound (b), a metal alkoxide and a metal acyloxide are preferred, the metal alkoxide that is neither hydrolyzed nor hydrolytic condensed, and the metal acyloxide that is neither hydrolyzed nor hydrolytically condensed are more preferred, and the metal alkoxide that is neither hydrolyzed nor hydrolytic condensed is still more preferred.

Examples of the metal-containing compound (b) include zirconium tetra-n-butoxide, zirconium tetra-n-propoxide, zirconium tetraisopropoxide, hafnium tetraethoxide, indium triisopropoxide, hafnium tetraisopropoxide, hafnium tetrabutoxide, tantalum tetrabutoxide, tantalum pentaethoxide, tantalum pentabutoxide, tungsten tetrabutoxide, tungsten pentamethoxide, tungsten pentabutoxide, tungsten hexaethoxide, tungsten hexabutoxide, iron chloride, zinc diisopropoxide, zinc acetate dihydrate, tetrabutyl orthotitanate, titanium tetra-n-butoxide, titanium tetra-n-propoxide, zirconium di-n-butoxide bis(2,4-pentanedionate), titanium tri-n-butoxide stearate, bis(cyclopentadienyl)hafnium dichloride, bis(cyclopentadienyl)tungsten dichloride, diacetato[(S)-(−)-2,2'-bis(diphenylphosphino)-1,1'-binaphthyl]ruthenium, dichloro[ethylenebis(diphenylphosphine)]cobalt, titanium butoxide oligomers, aminopropyltrimethoxytitanium, aminopropyltriethoxyzirconium, 2-(3,4-epoxycyclohexyl)ethyltrimethoxyzirconium, γ-glycidoxypropyltrimethoxyzirconium, 3-isocyanopropyltrimethoxyzirconium, 3-isocyanopropyltriethoxyzirconium, triethoxymono(acetylacetonato)titanium, tri-n-propoxymono(acetylacetonato)titanium, tri-i-propoxymono(acetylacetonato)titanium, triethoxymono(acetylacetonato)zirconium, tri-n-propoxymono(acetylacetonato)zirconium, tri-i-propoxymono(acetylacetonato)zirconium, diisopropoxybis(acetylacetonato)titanium, di-n-butoxybis(acetylacetonato)titanium, di-n-butoxybis(acetylacetonato)zirconium, tri(3-methacryloxypropyl)methoxyzirconium, tri(3-acryloxypropyl)methoxyzirconium, tin tetraisopropoxide, tin tetrabutoxide, lanthanum oxide, yttrium oxide, and the like. Of these, alkoxides of titanium, zirconium, hafnium, tantalum, tungsten and tin are preferred; titanium tetra-n-butoxide, titanium tetra-n-propoxide, zirconium tetra-n-butoxide, zirconium tetra-n-propoxide, zirconium tetraisopropoxide, hafnium tetraethoxide, hafnium tetraisopropoxide, hafnium tetrabutoxide, tantalum tetrabutoxide, tantalum pentaethoxide, tantalum pentabutoxide, tungsten tetrabutoxide, tungsten pentamethoxide, tungsten pentabutoxide, tungsten hexaethoxide, tungsten hexabutoxide, tin tetraisopropoxide and tin tetrabutoxide are more preferred; and titanium tetra-n-butoxide, zirconium tetraisopropoxide, hafnium tetraisopropoxide, tantalum tetrabutoxide, tungsten tetrabutoxide and tin tetrabutoxide are still more preferred.

In the case of using the organic acid in synthesizing the particles (A), the lower limit of the amount of the organic acid used is preferably 10 parts by mass, and more preferably 30 parts by mass with respect to 100 parts by mass of the metal-containing compound (b). Meanwhile, the upper limit of the amount of the organic acid used is preferably 1,000 parts by mass, more preferably 700 parts by mass, still more preferably 200 parts by mass, and particularly preferably 100 parts by mass with respect to 100 parts by mass of the metal-containing compound (b). When the amount of the organic acid used falls within the above range, an appropriate adjustment of a percentage content of the organic acid (a) in the particles (A) to be obtained is enabled, and consequently more improvements of the LWR performance and the sensitivity of the radiation-sensitive composition are enabled.

Upon the synthesis reaction of the particles (A), in addition to the metal compound (I) and the organic acid (a), a compound that may be the polydentate ligand represented by L in the compound of the formula (A), a compound that may be a bridging ligand, etc., may also be added. The compound that may be the bridging ligand is exemplified by a compound having a hydroxy group, an isocyanate group, an amino group, an ester group and an amide group each in a plurality of number, and the like.

A procedure for carrying out the hydrolytic condensation reaction using the metal-containing compound (b) may be exemplified by: a procedure of hydrolytically condensing the metal-containing compound (b) in a solvent containing water; and the like. In this case, other compound having a hydrolyzable group may be added as needed. The lower limit of the amount of water used for the hydrolytic condensation reaction is preferably 0.2 times molar amount, more preferably an equimolar amount, and still more preferably 3 times molar amount with respect to the hydrolyzable group included in the metal-containing compound (b) and the like. The upper limit of the amount of water is preferably 20 times molar amount, more preferably 15 times molar amount, and further more preferably 10 times molar amount. When the amount of the water in the hydrolytic condensation reaction falls within the above range, it is possible to increase the percentage content of the metal oxide in the particles (A) to be obtained, whereby more improvements of the LWR performance and the sensitivity of the radiation-sensitive composition are enabled.

A procedure for carrying out the ligand substitution reaction using the metal-containing compound (b) may be exemplified by: a procedure of mixing the metal-containing compound (b) and the organic acid (a); and the like. In this case, the mixing may be carried out either in a solvent or without a solvent. Upon the mixing, a base such as triethylamine may be added as needed. An amount of the base added is, for example, no less than 1 part by mass and no greater than 200 parts by mass with respect to a total amount of the metal-containing compound (b) and the organic acid (a) used being 100 parts by mass.

The solvent for use in the synthesis reaction of the particles (A) is not particularly limited, and solvents similar to those exemplified in connection with the solvent (E) described later may be used. Of these, alcohol solvents, ether solvents, ester solvents, and hydrocarbon solvents are preferred; alcohol solvents, ether solvents and ester solvents are more preferred; polyhydric alcohol partial ether solvents, monocarboxylic acid ester solvents and cyclic ether solvents are still more preferred; and propylene glycol monoethyl ether, ethyl acetate and tetrahydrofuran are particularly preferred.

In the case of using the solvent in the synthesis reaction of the particles (A), the solvent used may be either removed after the completion of the reaction, or directly used as the solvent (E) in the radiation-sensitive composition without removal thereof.

The lower limit of the temperature of the synthesis reaction of the particles (A) is preferably 0° C., and more preferably 10° C. The upper limit of the aforementioned temperature is preferably 150° C., and more preferably 100° C.

The lower limit of the time period of the synthesis reaction of the particles (A) is preferably 1 min, more preferably 10 min, and still more preferably 1 hour. The upper limit of the time period is preferably 100 hrs, more preferably 50 hrs, and further more preferably 10 hrs.

(B) Cation

The cation (B) includes a metal.

The metal included in the cation (B) is exemplified by an element from group 2, group 3, group 4, group 5, group 6, group 7, group 8, group 9, group 10, group 11 and group 12, and the like. Of these, in light of more enhancement of the sensitivity, an element from group 2, group 3, group 11, group 12 and group 13 is preferred.

The cation (B) is preferably a cation of copper, zinc, barium, lanthanum, cerium, yttrium, indium or silver in light of further enhancement of the sensitivity.

The cation (B) may be a monovalent cation, a divalent cation, a trivalent cation, or a cation having a valency of no less than 4.

The cation (B) is not particularly limited as long as the metal is included, and may be, for example, a metal cation (hereinafter, may be also referred to as "(B1) cation" or "cation (B1)" that is a cation represented by $M^{n+}$, wherein M is a metal atom; and n is an integer of no less than 1), a metal complex cation (hereinafter, may be also referred to as "(B2) cation" or "cation (B2)" that is a cation represented by the following formula (Z)), or the like.

$$[MR^1{}_x]^{n+} \qquad (Z)$$

In the above formula (Z), M represents a metal atom; $R^1$ represents a ligand; x is an integer of 0 to 6, wherein in a case where x is no less than 2, a plurality of $R^1$ may be identical or different.

The ligand represented by $R^1$ is exemplified by a monodentate ligand and a polydentate ligand.

Exemplary monodentate ligand includes a hydroxo ligand (OH), a carboxy ligand (COOH), an amide ligand, an acyloxy ligand, an amine ligand, an ammonia ligand, a substituted or unsubstituted hydrocarbon group ligand, and the like.

Examples of the amido ligand include an unsubstituted amido ligand ($NH_2$), a methylamido ligand (NHMe), a dimethylamido ligand ($NMe_2$), a diethylamido ligand ($NEt_2$), a dipropylamido ligand ($NPr_2$), and the like.

Examples of the acyloxy ligand include a formyloxy ligand, an acetyloxy ligand, a propionyloxy ligand, a stearoyloxy ligand, an acryloxy ligand, and the like.

Examples of the amine ligand include a pyridine ligand, a trimethylamine ligand, a piperidine ligand, an ammonia ligand, and the like.

Examples of the hydrocarbon group ligand include: alkyl group ligands such as a methyl group ligand; cycloalkyl group ligands such as a cyclohexyl group ligand; aryl group ligands such as a phenyl group ligand; aralkyl group ligands such as a benzyl group ligand; and the like. A substituent of the hydrocarbon group ligand may be an alkoxy group, a hydroxy group, a halogen atom, or the like.

Exemplary polydentate ligand includes a hydroxyacid ester, a β-diketone, a β-keto ester, a β-dicarboxylic acid ester, an o-acylphenol, a hydrocarbon having a π bond, a diphosphine, and the like.

Examples of the hydroxy acid ester include glycolic acid esters, lactic acid esters, 2-hydroxycyclohexane-1-carboxylic acid esters, salicylic acid esters, and the like.

Examples of the β-diketone include acetylacetone, 3-methyl-2,4-pentanedione, 3-ethyl-2,4-pentanedione, 2,2-dimethyl-3,5-hexanedione, and the like.

Examples of the β-keto ester include acetoacetic acid esters, α-alkyl-substituted acetoacetic acid esters, β-ketopentanoic acid esters, benzoylacetic acid esters, 1,3-acetonedicarboxylic acid esters, and the like.

Examples of the β-dicarboxylic acid ester include malonic acid diesters, α-alkyl-substituted malonic acid diesters, α-cycloalkyl-substituted malonic acid diesters, α-aryl-substituted malonic acid diesters, and the like.

Examples of the o-acylphenol include o-hydroxyacetophenone, o-hydroxybenzophenone, and the like.

Examples of the hydrocarbon having a π bond include:
chain olefins such as ethylene and propylene;
cyclic olefins such as cyclopentene, cyclohexene and norbornene;
chain dienes such as butadiene and isoprene;
cyclic dienes such as cyclopentadiene, methylcyclopentadiene, pentamethylcyclopentadiene, cyclohexadiene and norbornadiene;
aromatic hydrocarbons such as benzene, toluene, xylene, hexamethylbenzene, naphthalene and indene; and the like.

Examples of the diphosphine include 1,1-bis(diphenylphosphino)methane, 1,2-bis(diphenylphosphino)ethane, 1,3-bis(diphenylphosphino)propane, 2,2'-bis(diphenylphosphino)-1,1'-binaphthyl, 1,1'-bis(diphenylphosphino)ferrocene, and the like.

The ligand represented by $R^1$ is preferably the acyloxy ligand, the amine ligand, the substituted or unsubstituted hydrocarbon group ligand, the β-diketone, the o-acylphenol or the hydrocarbon having a π bond, more preferably an acetyloxy ligand, the stearoyloxy ligand, the substituted or unsubstituted aryl group ligand, pyridine, acetylacetone, 3,3-dimethyl-3,5-hexanedione, o-hydroxyacetophenone or cyclopentadiene, and still more preferably a mesityl group ligand.

It is preferred that x is 1 to 3.

It is preferred that n is 1 to 5, more preferably 1 to 4, and still more preferably 1 to 3.

The cation (B) is preferably the cation (B1), and more preferably a copper(II) cation, a zinc(II) cation, a barium(II) cation, a lanthanum(II) cation, a cerium(III) cation, an yttrium(III) cation or a silver(I) cation.

Alternatively, the cation (B) is preferably the cation (B2). Of the candidates of the cation (B2), a cation represented by the following formula is more preferred.

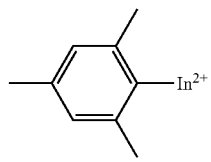

The lower limit of the content of the cation (B) with respect to 100 parts by mass of the particles (A) is preferably 0.1 parts by mass, more preferably 0.5 parts by mass, and still more preferably 1 part by mass. The upper limit of the content is preferably 30 parts by mass, more preferably 20 parts by mass, and still more preferably 10 parts by mass. When the content of the cation (B) falls within the above range, the LWR performance and the sensitivity of the radiation-sensitive composition can be more improved.

(C) Anion

The anion (C) is preferably a conjugated base of the acid (I) having a pKa of no greater than 3.

The upper limit of the pKa of the acid (I) is typically 3, preferably 2, more preferably 1, still more preferably 0, particularly preferably −1, and further particularly preferably −2. The lower limit of the pKa is preferably −8, more preferably −6, and still more preferably −4. When the pKa of the acid (I) falls within the above range, improvements of the LWR performance and the sensitivity of the radiation-sensitive composition are enabled.

The lower limit of the van der Waals volume of the acid (I) is preferably $1.5 \times 10^{-28}$ $m^3$, more preferably $2.5 \times 10^{-28}$ $m^3$, still more preferably $3.0 \times 10^{-28}$ $m^3$, particularly preferably $3.2 \times 10^{-28}$ $m^3$, and further particularly preferably $3.5 \times 10^{-28}$ $m^3$. Whereas, the upper limit of the van der Waals volume is preferably $1.0 \times 10^{-27}$ $m^3$, and more preferably $6.0 \times 10^{-28}$ $m^3$. When the van der Waals volume falls within the above range, an appropriate decrease in diffusion level of the acid of the radiation-sensitive composition is enabled, leading to a more improvement of the LWR performance. The "van der Waals volume" as referred to means a volume of a region occupied by van der Waals spheres based on van der Waal s radii of atoms constituting the acid (I), and is a value calculated by determining a stable structure according to a PM3 method by using computation software, for example, WinMOPAC (available from Fujitsu Limited, Ver. 3.9.0) or the like.

The anion (C) is not particularly limited as long as it is a conjugated base of the acid (I), and may be either a monovalent anion, or an anion having a valency of no less than 2. Of these, the monovalent anion is preferred.

Examples of the acid (I) include sulfonic acid, nitric acid, organic azinic acid, disulfonylimidic acid, and the like. The "organic azinic acid" as referred to means a compound represented by $R^X R^Y C=N(O)OH$ (wherein, $R^X$ and $R^Y$ each independently represent a monovalent organic group, or $R^X$ and $R^Y$ taken together represent a ring structure together with the carbon atom to which $R^X$ and $R^Y$ bond).

The anion (C) is exemplified by a sulfonic acid anion, a nitric acid anion, an organic azinic acid anion, a disulfonylimidic acid anion and the like.

Examples of the sulfonic acid anion include an anion represented by the following formula (i) (hereinafter, may be also referred to as "anion (i)") and the like.

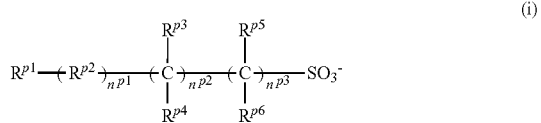

(i)

In the above formula (i), $R^{p1}$ represents a hydrogen atom, a fluorine atom or a monovalent organic group having 1 to 20 carbon atoms; $R^{p2}$ represents a divalent linking group; $R^{p3}$ and $R^{p4}$ each independently represent a hydrogen atom, a fluorine atom, a monovalent hydrocarbon group having 1 to 20 carbon atoms, or a monovalent fluorinated hydrocarbon group having 1 to 20 carbon atoms; $R^{p5}$ and $R^{p6}$ each independently represent a fluorine atom or a monovalent fluorinated hydrocarbon group having 1 to 20 carbon atoms; $n^{p1}$ is an integer of 0 to 10; $n^{p2}$ is an integer of 0 to 10; $n^{p3}$ is an integer of 1 to 10, wherein in a case where $n^{p1}$ is no less than 2, a plurality of $R^{p2}$s may be identical or different, in a case where $n^{p2}$ is no less than 2, a plurality of $R^{p3}$s may be identical or different and a plurality of $R^{p4}$s may be identical or different, and in a case where $n^{p3}$ is no less than 2, a plurality of $RP^{p5}$s may be identical or different and a plurality of $R^{p6}$s may be identical or different.

The monovalent organic group which may be represented by $R^{p1}$ is exemplified by: a monovalent hydrocarbon group having 1 to 20 carbon atoms; a group (a) that includes a divalent hetero atom-containing group between two adjacent carbon atoms of the monovalent hydrocarbon group having 1 to 20 carbon atoms; a group obtained from the monovalent hydrocarbon group having 1 to 20 carbon atoms, or the group (a) by substituting a part or all of hydrogen atoms included therein with a monovalent hetero atom-containing group; and the like.

Exemplary monovalent hydrocarbon group having 1 to 20 carbon atoms includes a monovalent chain hydrocarbon group having 1 to 20 carbon atoms, a monovalent alicyclic hydrocarbon group having 3 to 20 carbon atoms, a monovalent aromatic hydrocarbon group having 6 to 20 carbon atoms, and the like.

Examples of the monovalent chain hydrocarbon group having 1 to 20 carbon atoms include:

alkyl groups such as a methyl group, an ethyl group, a n-propyl group and an i-propyl group;

alkenyl groups such as an ethenyl group, a propenyl group and a butenyl group;

alkynyl groups such as an ethynyl group, a propynyl group and a butynyl group; and the like.

Examples of the monovalent alicyclic hydrocarbon group having 3 to 20 carbon atoms include:

monocyclic cycloalkyl groups such as a cyclopentyl group and a cyclohexyl group;

monocyclic cycloalkenyl groups such as a cyclopentenyl group and a cyclohexenyl group;

polycyclic cycloalkyl groups such as a norbornyl group, an adamantyl group and a tricyclodecyl group;

polycyclic cycloalkenyl groups such as a norbornenyl group and a tricyclodecenyl group; and the like.

Examples of the monovalent aromatic hydrocarbon group having 6 to 20 carbon atoms include:

aryl groups such as a phenyl group, a tolyl group, a xylyl group, a naphthyl group and an anthryl group;

aralkyl groups such as a benzyl group, a phenethyl group, a naphthylmethyl group and an anthrylmethyl group; and the like.

Examples of the hetero atom constituting the monovalent and divalent hetero atom-containing group include an oxygen atom, a nitrogen atom, a sulfur atom, a phosphorus atom, a silicon atom, a halogen atom, and the like. The halogen atom is exemplified by a fluorine atom, a chlorine atom, a bromine atom, an iodine atom, and the like.

The divalent hetero atom-containing group is exemplified by —O—, —CO—, —S—, —CS—, —NR'—, a group obtained by combining two or more of these, or the like, wherein R' represents a hydrogen atom or a monovalent hydrocarbon group.

Examples of the monovalent hetero atom-containing group include halogen atoms such as a fluorine atom, a chlorine atom, a bromine atom and an iodine atom, a hydroxy group, a carboxy group, a cyano group, an amino group, a sulfanyl group (—SH), and the like.

The monovalent organic group represented by $R^{p1}$ is preferably a monovalent group that includes a ring structure having 5 or more ring atoms. The monovalent group that includes a ring structure having 5 or more ring atoms is exemplified by a monovalent group that includes an alicyclic structure having 5 or more ring atoms, a monovalent group that includes an aliphatic hetero ring structure having 5 or more ring atoms, a monovalent group that includes an aromatic ring structure having 5 or more ring atoms, a monovalent group that includes an aromatic hetero ring structure having 5 or more ring atoms, and the like. When $R^{p1}$ represents the aforementioned group, further appropriate shortening of the diffusion length of the acid (I) is enabled, and as a result, a more improvement of the LWR performance of the radiation-sensitive composition is enabled.

Examples of the alicyclic structure having 5 or more ring atoms include:

monocyclic cycloalkane structures such as a cyclohexane structure, a cycloheptane structure, a cyclooctane structure, a cyclononane structure, a cyclodecane structure and a cyclododecane structure;

monocyclic cycloalkene structures such as a cyclohexene structure, a cycloheptene structure, a cyclooctene structure and a cyclodecene structure;

polycyclic cycloalkane structures such as a norbornane structure, an adamantane structure, a tricyclodecane structure and a tetracyclododecane structure;

polycyclic cycloalkene structures such as a norbornene structure and a tricyclodecene structure; and the like.

Examples of the aliphatic hetero ring structure having 5 or more ring atoms include:

lactone structures such as a hexanolactone structure and a norbornanelactone structure;

sultone structures such as a hexanosultone structure and a norbornanesultone structure;

oxygen atom-containing hetero ring structures such as an oxacycloheptane structure and an oxanorbornane structure;

nitrogen atom-containing hetero ring structures such as an azacyclohexane structure and a diazabicyclooctane structure;

sulfur atom-containing hetero ring structures such as a thiacyclohexane structure and a thianorbornane structure; and the like.

Examples of aromatic ring structure having 5 or more ring atoms include a benzene structure, a naphthalene structure, a phenanthrene structure, an anthracene structure, and the like.

Examples of the aromatic hetero ring structure having 5 or more ring atoms include: oxygen atom-containing hetero ring structures such as a furan structure, a pyran structure and a benzopyran structure; nitrogen atom-containing hetero ring structures such as a pyridine structure, a pyrimidine structure and an indole structure; and the like.

The lower limit of the number of the ring atoms of the ring structure in $R^{p1}$ is preferably 7, more preferably 8, still more preferably 9, and particularly preferably 10. Whereas, the upper limit of the number of the ring atoms is preferably 15, more preferably 14, still more preferably 13, and particularly preferably 12. When the number of the ring atoms falls within the above range, further appropriate shortening of the diffusion length of the acid is enabled, and as a result, a more improvement of the LWR performance of the radiation-sensitive composition is enabled.

A part or all of hydrogen atoms included in the ring structure in $R^{p1}$ may be substituted with a substituent. Examples of the substituent include halogen atoms such as a fluorine atom, a chlorine atom, a bromine atom and an iodine atom, a hydroxy group, a carboxy group, a cyano group, a nitro group, an alkoxy group, an alkoxycarbonyl group, an alkoxycarbonyloxy group, an acyl group, an acyloxy group, and the like. Of these, a hydroxy group is preferred.

$R^{p1}$ represents preferably a fluorine atom, a monovalent group that includes an alicyclic structure having 5 or more ring atoms, or a monovalent group that includes an aliphatic hetero ring structure having 5 or more ring atoms, more preferably a fluorine atom, a monovalent group that includes an alicyclic structure having 9 or more ring atoms, or a monovalent group that includes an aliphatic hetero ring structure having 9 or more ring atoms, and still more preferably a fluorine atom, an adamantyl group, a 4-oxoadamantyl group and a 5,6-(diphenylmethanediyldioxy)norbornan-2-yl group.

Examples of the divalent linking group represented by $R^{p2}$ include a carbonyl group, an ether group, a carbonyloxy group, a sulfide group, a thiocarbonyl group, a sulfonyl group, a divalent hydrocarbon group, and the like. The divalent linking group represented by $R^{p2}$ is preferably a carbonyloxy group, a sulfonyl group, an alkanediyl group and a cycloalkanediyl group, more preferably a carbonyloxy group and a cycloalkanediyl group, still more preferably a carbonyloxy group and a norbornanediyl group, and particularly preferably a carbonyloxy group.

The monovalent hydrocarbon group having 1 to 20 carbon atoms which may be represented by $RP^3$ or $R^{p4}$ is exemplified by an alkyl group having 1 to 20 carbon atoms, and the like. The monovalent fluorinated hydrocarbon group having 1 to 20 carbon atoms which may be represented by $R^{p3}$ or $R^{p4}$ is exemplified by a fluorinated alkyl group having 1 to 20 carbon atoms, and the like. $R^{p3}$ and $R^{p4}$ each represent preferably a hydrogen atom, a fluorine atom or a fluorinated alkyl group, more preferably a fluorine atom or a perfluoroalkyl group, and still more preferably a fluorine atom or a trifluoromethyl group.

The monovalent fluorinated hydrocarbon group having 1 to 20 carbon atoms which may be represented by $R^{p5}$ or $R^{p6}$ is exemplified by a fluorinated alkyl group having 1 to 20 carbon atoms, and the like. $R^{p5}$ and $R^{p6}$ each represent preferably a fluorine atom or a fluorinated alkyl group, more preferably a fluorine atom or a perfluoroalkyl group, still more preferably a fluorine atom or a trifluoromethyl group, and particularly preferably a fluorine atom.

In the above formula, $n^{p1}$ is preferably an integer of 0 to 5, more preferably an integer of 0 to 3, still more preferably an integer of 0 to 2, and particularly preferably 0 and 1.

In the above formula, $n^{p2}$ is preferably an integer of 0 to 5, more preferably an integer of 0 to 2, still more preferably 0 and 1, and particularly preferably 0.

In the above formula, $n^{p3}$ is preferably an integer of 1 to 5, more preferably an integer of 1 to 4, still more preferably an integer of 1 to 3, and particularly preferably 1 and 2.

Examples of the anion (i) include anions represented by the following formulae (i-1) to (i-17) (hereinafter, may be also referred to as "anions (i-1) to (i-17)"), and the like.

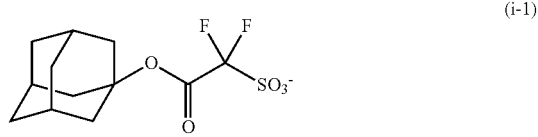

(i-1)

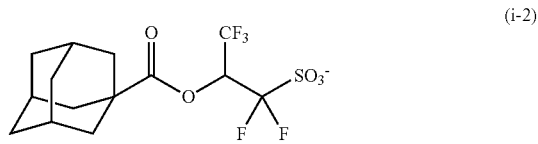

(i-2)

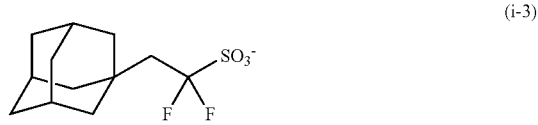

(i-3)

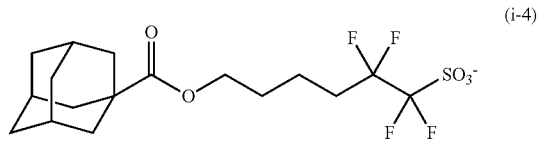

(i-4)

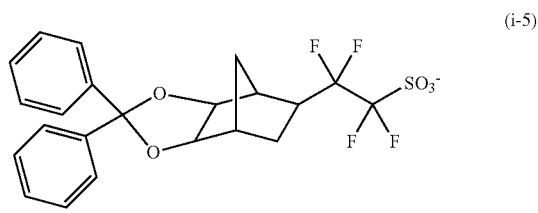

(i-5)

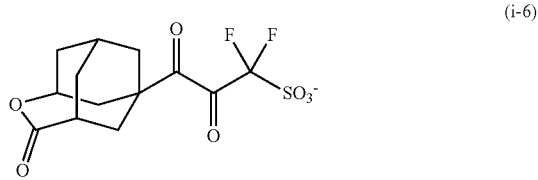

(i-6)

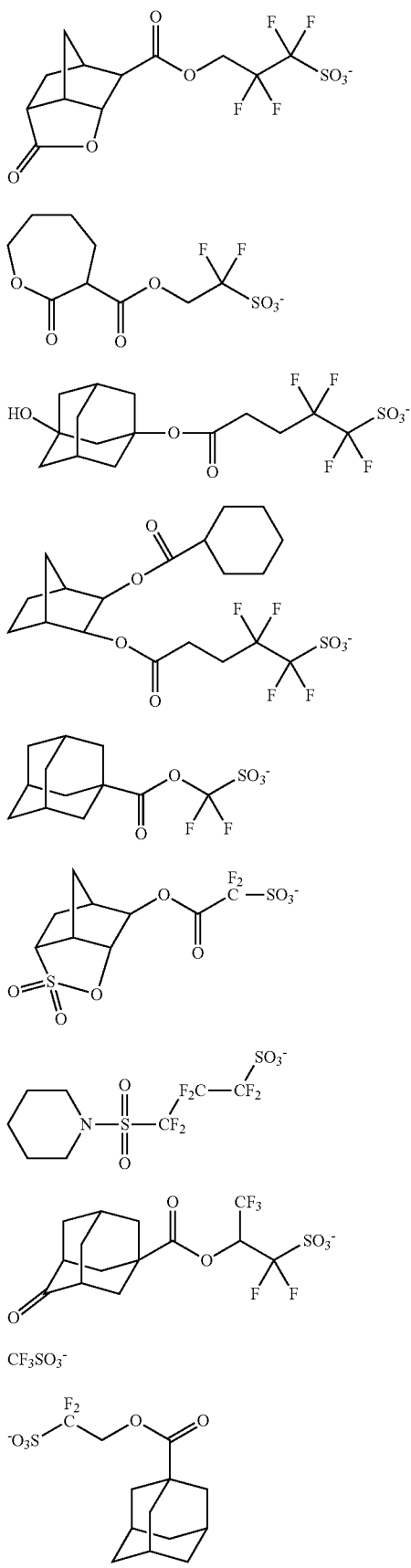

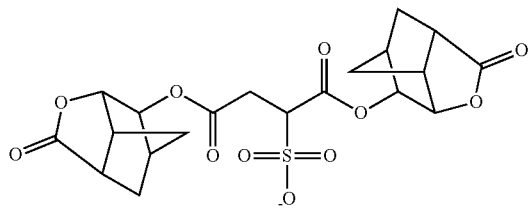

As the anion (i), the anions (i-3), (i-5), (i-14), (i-15), (i-16) and (i-17), a nonafluorobutanesulfonate anion and a 2-dodecylbenzenesulfonate anion are preferred.

Exemplary disulfonylimidic acid anion includes an anion represented by the following formula (ii) (hereinafter, may be also referred to as "anion (ii)"), and the like.

$$R^A-SO_2\diagdown N^-\diagup R^B-SO_2 \quad (ii)$$

In the above formula (ii), $R^A$ and $R^B$ each independently represent a monovalent organic group having 1 to 20 carbon atoms, or $R^A$ and $R^B$ taken together represent a ring structure having 5 to 20 ring atoms together with the atom chain to which $R^A$ and $R^B$ bond.

Examples of the monovalent organic group having 1 to 20 carbon atoms which may be represented by $R^A$ or $R^B$ include similar groups to those exemplified as the monovalent organic group which may be represented by $R^{p1}$, and the like.

$R^A$ and $R^B$ each represent preferably an alkyl group having 1 to 20 carbon atoms, a substituted or unsubstituted fluorinated alkyl group having 1 to 20 carbon atoms, or a substituted or unsubstituted aryl group having 6 to 20 carbon atoms, more preferably an alkyl group having 1 to 20 carbon atoms, an organic sulfonyl group-substituted or unsubstituted fluorinated alkyl group having 1 to 20 carbon atoms, or a fluorine-substituted, chlorine-substituted, nitro-substituted or unsubstituted aryl group having 6 to 20 carbon atoms, still more preferably an alkyl group having 1 to 20 carbon atoms, a piperidyl sulfonyl-substituted, cyclohexylphenylsulfonyl-substituted or unsubstituted perfluoroalkyl group having 1 to 20 carbon atoms, or a fluorine-substituted, trifluoromethyl group-substituted, chlorine-substituted, nitro-substituted or unsubstituted phenyl group having 1 to 20 carbon atoms, and particularly preferably a methyl group, a piperidylsulfonylhexafluoropropyl group, a cyclohexylphenylsulfonylhexafluoropropyl group, a trifluoromethyl group, a pentafluoroethyl group, a nonafluorobutyl group, a heptadecafluorooctyl group, a pentafluorophenyl group, a di(trifluoromethyl) phenyl group, a chlorophenyl group, a nitrophenyl group or a phenyl group.

Examples of the ring structure having 5 to 20 ring atoms which may be taken together represented by $R^A$ and $R^B$ groups together with the atom chain to which $R^A$ and $R^B$ bond include sulfonylimide ring structures such as an ethylenedisulfonylimide ring structure, a propylenedisulfonylimide ring structure, a butylenedisulfonylimide ring structure and a pentylenedisulfonylimide ring structure, and the like.

The group which may be taken together represented by $R^A$ and $R^B$ is preferably a fluorinated alkanediyl group, more preferably a perfluoroalkanediyl group, and still more preferably a tetrafluoroethanediyl group, a hexafluoropropanediyl group and an octafluorobutanediyl group.

Examples of the anion (ii) include anions represented by the following formulae (ii-1) to (ii-26) (hereinafter, may be also referred to as "anions (ii-1) to (ii-26)"), and the like.

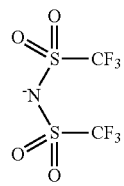
(ii-1)

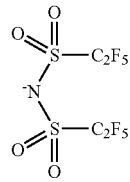
(ii-2)

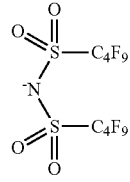
(ii-3)

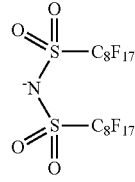
(ii-4)

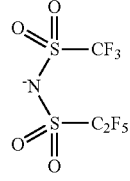
(ii-5)

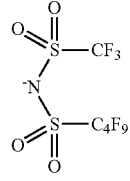
(ii-6)

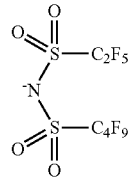
(ii-7)

-continued

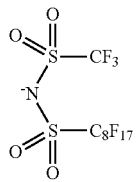
(ii-8)

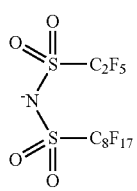
(ii-9)

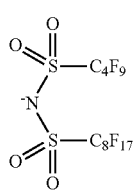
(ii-10)

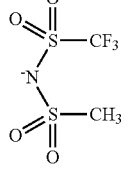
(ii-11)

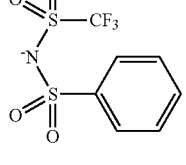
(ii-12)

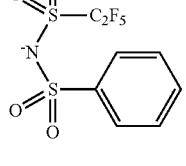
(ii-13)

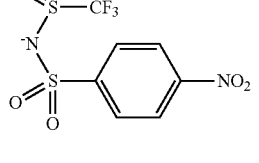
(ii-14)

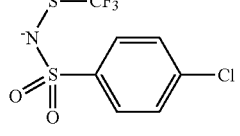
(ii-15)

(ii-16) 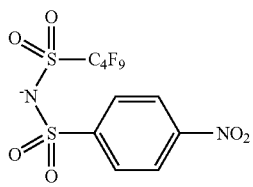

(ii-17) 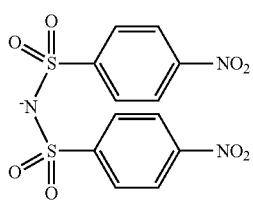

(ii-18) 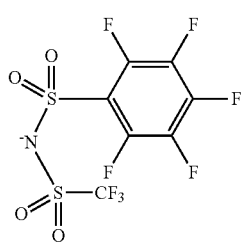

(ii-19) 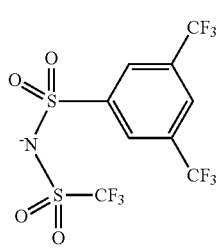

(ii-20) 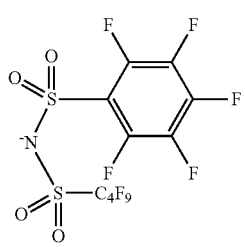

(ii-21) 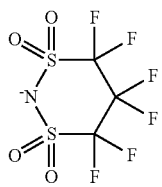

(ii-22) 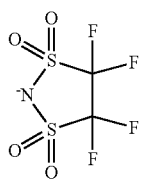

(ii-23) 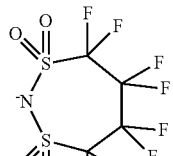

(ii-24) 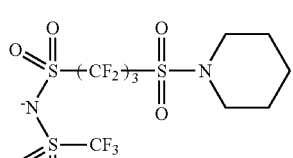

(ii-25) 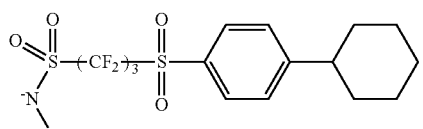

(ii-26) 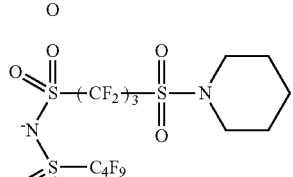

The anion (II) is preferably the anion (ii-24).

The anion (C) is preferably the sulfonic acid anion or the disulfonylimidic acid anion.

The lower limit of the content of the anion (C) with respect to 100 parts by mass of the particles (A) is preferably 0.1 parts by mass, more preferably 0.5 parts by mass, and still more preferably 1 part by mass. The upper limit of the content is preferably 30 parts by mass, more preferably 20 parts by mass, and still more preferably 10 parts by mass. When the content of the anion (C) falls within the above range, more improvements of the LWR performance and the sensitivity of the radiation-sensitive composition are enabled.

The lower limit of the total content of the cation (B) and the anion (C) with respect to 100 parts by mass of the particles (A) is preferably 1 part by mass, more preferably 2 parts by mass, still more preferably 5 parts by mass, and particularly preferably 7 parts by mass. The upper limit of the total content is preferably 50 parts by mass, more preferably 30 parts by mass, still more preferably 20 parts by mass, and particularly preferably 15 parts by mass. When the total content of the cation (B) and the anion (C) falls within the above range, further improvements of the LWR performance and the sensitivity of the radiation-sensitive composition are enabled.

The radiation-sensitive composition contains the cation (B) and the anion (C) typically as (X) a metal salt. The radiation-sensitive composition may be prepared by incorporating therein the metal salt (X) that includes the cation (B) and the anion (C). Alternatively, the cation (B) and the anion (C) contained in the radiation-sensitive composition may be derived from distinct metal salts. In other words, the radiation-sensitive composition may contain a first metal salt that includes the cation (B) and an anion other than the anion (C), and a second metal salt that includes the anion (C) and a cation other than the cation (B).

(X) Metal Salt

The metal salt (X) is a compound that includes the cation (B) and the anion (C). metal salt (X) functions as a radiation-sensitive acid generating agent that generates the acid (I) through an action of the radioactive ray such as EUV or an electron beam.

The metal salt (X) is exemplified by a compound represented by the following formula (1) (hereinafter, may be also referred to as "compound (1)").

$$[(G^{n+})_p(E^{m-})_q] \quad (1)$$

In the above formula (1), $G^{n+}$ represents the cation (B) having a valency of n; $E^{m-}$ represents the anion (C) having a valency of m; p is an integer of no less than 1; and q is an integer of no less than 1, wherein (n×p) is equal to (m×q).

The compound (I) may include one, or two or more types of $G^{n+}$ and $E^{m-}$, respectively.

Exemplary metal salt (X) includes a metal sulfonic acid salt, a metal nitric acid salt, a metal organic azinic acid salt, a metal disulfonylimidic acid salt and the like.

The metal salt (X) is preferably: a sulfonic acid salt of copper, zinc, barium, lanthanum, cerium, yttrium or indium; a nitric acid salt of lanthanum; or a disulfonylimidic acid salt of barium.

The lower limit of the content of the metal salt (X) with respect to 100 parts by mass of the particles (A) is preferably 1 part by mass, more preferably 2 parts by mass, still more preferably 5 parts by mass, and particularly preferably 7 parts by mass. The upper limit of the content is preferably 50 parts by mass, more preferably 30 parts by mass, still more preferably 20 parts by mass, and particularly preferably 15 parts by mass. When the content of the metal salt (X) falls within the above range, further improvements of the LWR performance and the sensitivity of the radiation-sensitive composition and sensitivity are enabled. The radiation-sensitive composition may contain one, or two or more types of the metal salt (X).

(D) Carboxylic Acid

Due to containing the carboxylic acid (D), the radiation-sensitive composition is capable of preventing aggregation of the particles (A) in a light-unexposed region, thereby enabling the LWR performance and the sensitivity to be more improved.

Examples of the carboxylic acid include:
monocarboxylic acids, e.g.,
saturated aliphatic monocarboxylic acids such as formic acid, acetic acid, propionic acid, butanoic acid, pentanoic acid, hexanoic acid, heptanoic acid, octanoic acid, nonanoic acid, decanoic acid, 2-ethylhexanoic acid and stearic acid;
unsaturated aliphatic monocarboxylic acids such as acrylic acid, methacrylic acid, trans-2,3-dimethyl acrylic acid, oleic acid, linoleic acid, linolenic acid and arachidonic acid;
aromatic monocarboxylic acids such as benzoic acid, salicylic acid, p-aminobenzoic acid, gallic acid and shikimic acid; and
halogen atom-containing monocarboxylic acids such as monochloroacetic acid, dichloroacetic acid, trichloroacetic acid, trifluoroacetic acid and pentafluoropropionic acid,
dicarboxylic acids, e.g.,
saturated aliphatic dicarboxylic acids such as oxalic acid, malonic acid, methylmalonic acid, succinic acid, glutaric acid, adipic acid, sebacic acid and tartaric acid;
unsaturated aliphatic dicarboxylic acids such as maleic acid and fumaric acid; and
aromatic dicarboxylic acids such as phthalic acid, isophthalic acid, terephthalic acid and naphthalene-2,6-dicarboxylic acid,
carboxylic acids having 3 or more carboxy groups such as citric acid; and the like.

The carboxylic acid (D) is preferably the monocarboxylic acid, more preferably the unsaturated monocarboxylic acid, still more preferably acrylic acid or methacrylic acid, and particularly preferably methacrylic acid.

In a case in which the radiation-sensitive composition contains the carboxylic acid (D), the lower limit of the content of the carboxylic acid (D) with respect to 100 parts by mass of the particles (A) is preferably 0.1 parts by mass, more preferably 1 part by mass, still more preferably 2 parts by mass, and particularly preferably 5 parts by mass. The upper limit of the content is preferably 50 parts by mass, more preferably 30 parts by mass, still more preferably 20 parts by mass, and particularly preferably 15 parts by mass.

(E) Solvent

The radiation-sensitive composition typically contains the solvent (E). The solvent (E) is not particularly limited as long as it is a solvent capable of dissolving or dispersing at least the particles (A), the cation (B), the anion (C), and optional component(s), etc., included as needed.

The solvent (E) is exemplified by an alcohol solvent, an ether solvent, a ketone solvent, an amide solvent, an ester solvent, a hydrocarbon solvent, and the like.

Examples of the alcohol solvent include:
aliphatic monohydric alcohol solvents having 1 to 18 carbon atoms such as 4-methyl-2-pentanol and n-hexanol;
alicyclic monohydric alcohol solvents having 3 to 18 carbon atoms such as cyclohexanol;
polyhydric alcohol solvents having 2 to 18 carbon atoms such as 1,2-propylene glycol;
C3-19 polyhydric alcohol partial ether solvents such as propylene glycol monomethyl ether; and the like.

Examples of the ether solvent include:
dialkyl ether solvents such as diethyl ether, dipropyl ether, dibutyl ether, dipentyl ether, diisoamyl ether, dihexyl ether and diheptyl ether;
cyclic ether solvents such as tetrahydrofuran and tetrahydropyran;
aromatic ring-containing ether solvents such as diphenyl ether and anisole (methyl phenyl ether); and the like.

Examples of the ketone solvent include:
chain ketone solvents such as acetone, methyl ethyl ketone, methyl n-propyl ketone, methyl n-butyl ketone, diethyl ketone, methyl iso-butyl ketone, 2-heptanone (methyl-n-pentylketone), ethyl n-butyl ketone, methyl n-hexyl ketone, di-iso-butyl ketone and trimethylnonanone;
cyclic ketone solvents such as cyclopentanone, cyclohexanone, cycloheptanone, cyclooctanone and methylcyclohexanone;
2,4-pentanedione, acetonylacetone and acetophenone; and the like.

Examples of the amide solvent include:
cyclic amide solvents such as N,N'-dimethylimidazolidinone and N-methylpyrrolidone;
chain amide solvents such as N-methylformamide, N,N-dimethylformamide, N,N-diethylformamide, acetamide, N-methylacetamide, N,N-dimethylacetamide and N-methylpropionamide; and the like.

Examples of the ester solvent include:

monocarboxylic acid ester solvents such as n-butyl acetate and ethyl lactate;

polyhydric alcohol carboxylate solvents such as propylene glycol acetate;

polyhydric alcohol partial ether carboxylate solvents such as propylene glycol monomethyl ether acetate;

lactone solvents such as γ-butyrolactone and δ-valerolactone;

polyhydric carboxylic acid diester solvents such as diethyl oxalate;

carbonate solvents such as dimethyl carbonate, diethyl carbonate, ethylene carbonate and propylene carbonate; and the like.

Examples of the hydrocarbon solvent include:

aliphatic hydrocarbon solvents having 5 to 12 carbon atoms such as n-pentane and n-hexane;

aromatic hydrocarbon solvents having 6 to 16 carbon atoms such as toluene and xylene; and the like.

Of these, the ester solvents are preferred, the polyhydric alcohol partial ether carboxylate solvents are more preferred, and propylene glycol monomethyl ether acetate is still more preferred. The radiation-sensitive composition may contain one, or two or more types of the solvent (E).

Other Optional Component

In addition to the components (A) to (E) described above, the radiation-sensitive composition may contain as other optional component(s), for example, an acid diffusion controller, a radiation-sensitive acid generator, a fluorine atom-containing polymer, a surfactant, and the like. The radiation-sensitive composition may contain one, or two or more types of each of the other optional component.

Acid Diffusion Controller

The radiation-sensitive composition may contain as needed, an acid diffusion controller. The acid diffusion controller controls a phenomenon of diffusion of the acid, which was generated from the metal salt (X), etc. upon the exposure, in the film, whereby the effect of inhibiting unwanted chemical reactions in an unexposed region is exhibited. In addition, the storage stability of the radiation-sensitive composition is further improved and the resolution thereof as a resist is more improved. Moreover, variation of the line width of the pattern caused by variation of post-exposure time delay from the exposure until a development treatment can be suppressed, which enables the radiation-sensitive composition with superior process stability to be obtained. The acid diffusion controller may be contained in the radiation-sensitive composition in the form of a free compound (hereinafter, may be referred to as "acid diffusion control agent" as appropriate) or in the form incorporated as a part of the polymer, or may be in both of these forms.

The acid diffusion control agent is exemplified by a compound represented by the following formula (a) (hereinafter, may be also referred to as "nitrogen-containing compound (I)"), a compound having two nitrogen atoms in a single molecule (hereinafter, may be also referred to as "nitrogen-containing compound (II)"), a compound having three nitrogen atoms (hereinafter, may be also referred to as "nitrogen-containing compound (III)"), an amide group-containing compound, a urea compound, a nitrogen-containing heterocyclic compound, and the like.

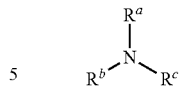

(a)

In the above formula (a), $R^a$, $R^b$ and $R^c$ each independently represent a hydrogen atom, a substituted or unsubstituted alkyl group, a substituted or unsubstituted monovalent alicyclic saturated hydrocarbon group, a substituted or unsubstituted aryl group, or a substituted or unsubstituted aralkyl group.

Examples of the nitrogen-containing compound (I) include: monoalkylamines such as n-hexylamine; dialkylamines such as di-n-butylamine; trialkylamines such as triethylamine and tri-n-pentylamine; aromatic amines such as aniline; and the like.

Examples of the nitrogen-containing compound (II) include ethylenediamine, N,N,N',N'-tetramethylethylenediamine, and the like.

Examples of the nitrogen-containing compound (III) include: polyamine compounds such as polyethyleneimine and polyallylamine; polymers of dimethylaminoethylacrylamide, etc.; and the like.

Examples of the amide group-containing compound include formamide, N-methylformamide, N,N-dimethylformamide, acetamide, N-methylacetamide, N,N-dimethylacetamide, propionamide, benzamide, pyrrolidone, N-methylpyrrolidone, and the like.

Examples of the urea compound include urea, methylurea, 1,1-dimethylurea, 1,3-dimethylurea, 1,1,3,3-tetramethylurea, 1,3-diphenylurea, tributylthiourea, and the like.

Examples of the nitrogen-containing heterocyclic compound include: pyridines such as pyridine and 2-methylpyridine; morpholines such as N-propylmorpholine and N-(undecan-1-ylcarbonyloxyethyl)morpholine; imidazoles such as imidazole, 2-phenylimidazole and 2,4,5-triphenylimidazole; pyrazine; pyrazole; and the like.

Alternatively, as the nitrogen-containing organic compound, a compound having an acid-labile group may be also used. Examples of the nitrogen-containing organic compound having an acid-labile group include N-t-butoxycarbonylpiperidine, N-t-butoxycarbonylimidazole, N-t-butoxycarbonylbenzimidazole, N-t-butoxycarbonyl-2-phenylbenzimidazole, N-(t-butoxycarbonyl)di-n-octylamine, N-(t-butoxycarbonyl)diethanolamine, N-(t-butoxycarbonyl)dicyclohexylamine, N-(t-butoxycarbonyl)diphenylamine, N-t-butoxycarbonyl-4-hydroxypiperidine, N-t-amyloxycarbonyl-4-hydroxypiperidine, and the like.

Also, as the acid diffusion control agent, a photodegradable base may be used which generates a relatively weaker acid than the acid (I) through photosensitization upon an exposure. The photodegradable base is exemplified by an onium salt compound that loses acid diffusion controllability through degradation upon an exposure, and the like. Examples of the onium salt compound include triphenylsulfonium salicylate, triphenylsulfonium 10-camphorsulfonate and the like.

In the case in which the radiation-sensitive composition contains the acid diffusion control agent, the lower limit of the content of the acid diffusion control agent with respect to 100 parts by mass of the particles (A) is preferably 0.1 parts by mass, more preferably 0.5 parts by mass, and still more preferably 1 part by mass. The upper limit of the content is preferably 20 parts by mass, more preferably 10 parts by mass, and still more preferably 5 parts by mass. One, or two or more types of the acid diffusion controller may be used.

Radiation-Sensitive Acid Generator

Since the acid is generated from the particles (A), the cation (B) and the anion (C) upon an exposure in the radiation-sensitive composition, the radiation-sensitive acid generator is not necessarily required. However, due to containing the radiation-sensitive acid generator, the radiation-sensitive composition is capable of further enhancing the sensitivity. The radiation-sensitive acid generator may be contained in the radiation-sensitive composition in the form of a low-molecular-weight compound (hereinafter, referred to as "radiation-sensitive acid generating agent" as appropriate) or in the form incorporated as a part of the particles (A), the cation (B), the anion (C) and the like, or may be in both of these forms.

The radiation-sensitive acid generating agent is exemplified by an onium salt compound, an N-sulfonyloxyimide compound, a halogen-containing compound, a diazo ketone compound and the like.

Examples of the onium salt compound include a sulfonium salt, a tetrahydrothiophenium salt, an iodonium salt, a phosphonium salt, a diazonium salt, a pyridinium salt, and the like.

Specific examples of the radiation-sensitive acid generating agent include compounds disclosed in paragraphs [0080] to [0113] of Japanese Unexamined Patent Application, Publication No. 2009-134088, and the like.

In the case in which the radiation-sensitive composition contains the radiation-sensitive acid generating agent, the lower limit of the content of the radiation-sensitive acid generating agent with respect to 100 parts by mass of the particles (A) is preferably 0.1 parts by mass, more preferably 1 part by mass, and still more preferably 5 parts by mass. The upper limit of the content is preferably 30 parts by mass, more preferably 20 parts by mass, and still more preferably 10 parts by mass. One, or two or more types of the radiation-sensitive acid generator may be used.

Fluorine Atom-Containing Polymer

The fluorine atom-containing polymer is a polymer having a fluorine atom. When the radiation-sensitive composition contains the fluorine atom-containing polymer, in forming the film, the fluorine atom-containing polymer tends to be localized in the surface region of the film due to oil-repellent characteristics thereof in the film. Thus, preventing the radiation-sensitive acid generator, the acid diffusion controller and the like used in liquid immersion lithography, etc., from elution into the liquid immersion medium is enabled. Moreover, due to the water-repellent characteristics of the fluorine atom-containing polymer, an advancing contact angle of a liquid immersion medium on the film can be controlled to fall within a desired range, thereby enabling generation of bubble defects to be inhibited. Furthermore, a greater receding contact angle of the liquid immersion medium on the film is attained, whereby an exposure by high-speed scanning without being accompanied by residual water beads is enabled. Accordingly, when the radiation-sensitive composition contains the fluorine atom-containing polymer, formation of a film suitable for liquid immersion lithography is enabled.

In the case in which the radiation-sensitive composition contains the fluorine atom-containing polymer, the lower limit of the content of the fluorine atom-containing polymer with respect to 100 parts by mass of the particles (A) is preferably 0.1 parts by mass, more preferably 0.5 parts by mass, and still more preferably 1 part by mass. The upper limit of the content is preferably 20 parts by mass, more preferably 15 parts by mass, and still more preferably 10 parts by mass.

Surfactant

The surfactant exerts the effect of improving the coating property, striation, developability, and the like. Examples of the surfactant include: nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate and polyethylene glycol distearate; and the like. Examples of the commercially available product of the surfactant include KP341 (Shin-Etsu Chemical Co., Ltd.), Polyflow No. 75 and Polyflow No. 95 (all available from Kyoeisha Chemical Co., Ltd.), EFTOP EF301, EFTOP EF303 and EFTOP EF352 (all available from Tochem Products Co. Ltd.), Megaface F171 and Megaface F173 (all available from DIC, Corporation), Fluorad FC430 and Fluorad FC431 (all available from Sumitomo 3M Limited), ASAHI GUARD AG710, Surflon S-382, Surflon SC-101, Surflon SC-102, Surflon SC-103, Surflon SC-104, Surflon SC-105 and Surflon SC-106 (all available from Asahi Glass Co., Ltd.), and the like.

In the case in which the radiation-sensitive composition contains the surfactant, the lower limit of the content of the surfactant with respect to 100 parts by mass of the particles (A) is preferably 0.1 parts by mass, and more preferably 0.3 parts by mass. The upper limit of the content is preferably 2 parts by mass, and more preferably 1 part by mass.

Preparation Procedure of Radiation-Sensitive Composition

The radiation-sensitive composition may be prepared, for example, by mixing at a certain ratio, the particles (A), the metal salt (X) that includes the cation (B) and the anion (C), as well as if necessary, the carboxylic acid (D), the solvent (E) and the optional component, preferably followed by filtering a mixture thus obtained through a membrane filter, etc. having a pore size of about 0.2 μm. The lower limit of the solid content concentration of the radiation-sensitive composition is preferably 0.1% by mass, more preferably 0.5% by mass, still more preferably 1% by mass, and particularly preferably 1.5% by mass. The upper limit of the solid content concentration is preferably 50% by mass, more preferably 30% by mass, still more preferably 10% by mass, and particularly preferably 5% by mass.

The radiation-sensitive composition may be used: for a development with an alkali in which an alkaline aqueous solution is used as a developer solution; or for a development with an organic solvent in which an organic solvent-containing liquid is used as a developer solution.

Pattern-Forming Method

The pattern-forming method of the embodiment of the invention includes the steps of: applying the radiation-sensitive composition described above directly or indirectly on an upper face side of a substrate (hereinafter, may be also referred to as "applying step"); exposing a film provided by the applying (hereinafter, may be also referred to as "exposure step"); and developing the film exposed (hereinafter, may be also referred to as "development step"). Since the radiation-sensitive composition of the embodiment of the present invention is used, the pattern-forming method enables a pattern accompanied by less LWR to be formed with superior sensitivity. Each step will be described below.

Applying Step

In this step, the radiation-sensitive composition is applied directly or indirectly on an upper face side of a substrate. Thus, a film is formed. The application procedure is not particularly limited, and application means such as e.g., spin-coating, cast coating or roll coating may be employed. The substrate is exemplified by a silicon wafer, a wafer coated with aluminum, and the like. Specifically, after the radiation-sensitive composition is applied such that the resultant film has a predetermined thickness, prebaking (PB) is executed as needed to evaporate off the solvent in the coating film.

The lower limit of the average thickness of the film is preferably 1 nm, more preferably 10 nm, still more preferably 20 nm, and particularly preferably 30 nm. The upper limit of the average thickness is preferably 1,000 nm, more preferably 200 nm, still more preferably 100 nm, and particularly preferably 70 nm.

The lower limit of the temperature of PB is preferably 60° C., and more preferably 80° C. The upper limit of the temperature of PB is preferably 140° C., and more preferably 120° C. The lower limit of the time period of PB is preferably 5 sec, and more preferably 10 sec. The upper limit of the time period of PB is preferably 600 sec, and more preferably 300 sec.

Exposure Step

In this step, the film formed by the applying step is exposed. The exposure is carried out by irradiating with a radioactive ray through a mask having a predetermined pattern via a liquid immersion medium such as water, as the case may be. Examples of the radioactive ray include: electromagnetic waves such as a visible light ray, an ultraviolet ray, a far ultraviolet ray, a vacuum ultraviolet ray (extreme ultraviolet ray (EUV); wavelength: 13.5 nm), an X-ray and a γ-ray; charged particle rays such as an electron beam and an α-ray; and the like. Of these, radioactive rays that allow more secondary electrons to be released from the metal atom included in the particles (A) and the cation (B), and the like by the exposure are preferred, and EUV and an electron beam are more preferred.

In addition, post exposure baking (PEB) may be carried out after the exposure. The lower limit of the temperature of PEB is preferably 50° C., and more preferably 80° C. The upper limit of the temperature of PEB is preferably 180° C., and more preferably 130° C. The lower limit of the time period of PEB is preferably 5 sec, and more preferably 10 sec. The upper limit of the time period of PEB is preferably 600 sec, and more preferably 300 sec.

In the embodiment of the present invention, in order to maximize the potential ability of the radiation-sensitive composition, for example, an organic or inorganic antireflective film may be formed on the substrate employed. In addition, in order to prevent influences of basic impurities etc., included in the environment atmosphere, a protective film may be also provided on the coating film, for example. Furthermore, in a case where an exposure by way of liquid immersion is carried out, in order to avoid direct contact of the film with the liquid immersion medium, a protective film for liquid immersion may be also provided on the film, for example.

Development Step

In this step, the film exposed in the exposure step is developed. A developer solution for use in the development is exemplified by an alkali aqueous solution, an organic solvent-containing liquid, and the like.

Examples of the alkali aqueous solution include alkaline aqueous solutions prepared by dissolving at least one alkaline compound such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide (TMAH), pyrrole, piperidine, choline, 1,8-diazabicyclo-[5.4.0]-7-undecene and 1,5-diazabicyclo-[4.3.0]-5-nonene, and the like.

The lower limit of the content of the alkaline compound in the alkali aqueous solution is preferably 0.1% by mass, more preferably 0.5% by mass, and still more preferably 1% by mass. The upper limit of the content is preferably 20% by mass, more preferably 10% by mass, and still more preferably 5% by mass.

The alkali aqueous solution is preferably an aqueous TMAH solution, and more preferably a 2.38% by mass aqueous TMAH solution.

Exemplary organic solvent in the organic solvent-containing liquid includes those similar to the organic solvents exemplified as the solvent (E) of the radiation-sensitive composition, and the like. Of these, the ester solvents are preferred, and butyl acetate is more preferred.

The lower limit of the content of the organic solvent in the organic solvent developer solution is preferably 80% by mass, more preferably 90% by mass, still more preferably 95% by mass, and particularly preferably 99% by mass.

These developer solutions may be used either alone of one type, or two or more types thereof in combination. It is to be noted that the development is typically followed by washing with water, etc., and drying.

A positive tone pattern can be obtained when the alkali aqueous solution is used as the developer solution. Whereas a negative tone pattern can be obtained when the organic solvent-containing liquid is used as the developer solution.

EXAMPLES

Hereinafter, the present invention is explained in detail by way of Examples, but the present invention is not in any way limited to these Examples. Each physical property value was determined by the following method.

Weight Average Molecular Weight (Mw) and Number Average Molecular Weight (Mn)

The Mw and the Mn were determined by gel permeation chromatography (GPC) using GPC columns ("G2000HXL"×2, "G3000HXL"×1 and "G4000HXL"×1, Tosoh Corporation) under the analytical conditions involving a flow rate: 1.0 mL/min, an elution solvent: tetrahydrofuran, a sample concentration: 1.0% by mass, an amount of injected sample: 100 µL, a column temperature: 40° C., and a detector: differential refractometer, with mono-dispersed polystyrene as a standard. Moreover, the dispersity index (Mw/Mn) was calculated from the results of the determination of the Mw and the Mn.

Particle Diameter of Particles (A)

The particle diameter of the particles (A) synthesized was measured by using a light scattering measurement apparatus ("ALV-5000", available from ALV-GmbH, Germany) under conditions involving a detection angle of 60° and a measurement time period of 120 sec.

Synthesis Example 1

Synthesis of Particles (A-1)

Into a nitrogen-substituted 500-mL three-neck flask, 20.0 g (58.7 mmol) of tetrabutyl orthotitanate, 100 mL of tetrahydrofuran and 100 mL of methacrylic acid were placed, and then the mixture was heated to 65° C. After the mixture was stirred for 20 min, 10.6 g (587 mmol) of water was added dropwise over 10 min. After the mixture was stirred at 65° C. for 18 hrs, 10.6 g (587 mmol) of water was further added dropwise over 10 min. After the mixture was stirred for 2 hrs, the reaction was stopped by allowing to cool to normal temperature. Particles were precipitated by adding 400 mL of water to the reaction liquid obtained. Thus precipitated particles were subjected to centrifugal separation at 3,000 rpm for 10 min, and the supernatant was decanted. The residual particles were dissolved in 50 g of acetone, and 400 mL of water was added again to permit precipitation. The precipitated particles were subjected to centrifugal separation at 3,000 rpm, and the supernatant was decanted. The particles thus obtained were dried at 10 Pa for 15 hrs to give 11.2 g of particles (A-1) (yield: 56%).

Synthesis Examples 2 to 6

Syntheses of Particles (A-2) to (A-6)

The particles (A-2) to (A-6) shown in Table 1 below were synthesized similarly to Synthesis Example 1 by using corresponding metal alkoxides shown in Table 1.

Synthesis Example 7

Synthesis of Particles (A-7)

Into a nitrogen-substituted 500-mL three-neck flask, 10.0 g of the particles (A-1) synthesized by Synthesis Example 1 described above, 100 mL of tetrahydrofuran and 30.0 g (24.6 mmol) of benzoic acid were placed, and then the mixture was stirred at room temperature for 24 hrs. Thereafter, 200 mL of water was added to precipitate the particles. To thus precipitated particles was added 25 g of acetone to permit dissolution, and the particles were precipitated by adding 200 mL of water. The particles precipitated were subjected to centrifugal separation at 3,000 rpm, and the supernatant was decanted. The particles thus obtained were dried at 10 Pa for 15 hrs to give 8.1 g of particles (A-7).

The measurements of yields (%) and particle diameters (nm) of the particles (A) synthesized as described above are together shown in Table 1 below.

TABLE 1

| (A) Particles | Basic ingredient: Metal alkoxide | Yield (%) | Particle diameter (nm) |
|---|---|---|---|
| A-1 | Ti(OBu)$_4$ | 56 | 1.5 |
| A-2 | Zr(OiPr)$_4$ | 50 | 1.2 |
| A-3 | Hf(OiPr)$_4$ | 58 | 1.2 |
| A-4 | Ta(OBu)$_4$ | 52 | 2.2 |
| A-5 | W(OBu)$_4$ | 53 | 1.8 |
| A-6 | Sn(OBu)$_4$ | 55 | 1.6 |
| A-7 | — | 78 | 1.4 |

Preparation of Radiation-Sensitive Composition

The metal salt (X), the carboxylic acid (D) and the solvent (E) which were used in the preparation of the radiation-sensitive composition are shown below.

(X) Metal Salt

X-1: copper(II) trifluoromethanesulfonate

X-2: compound represented by the following formula (X-2)

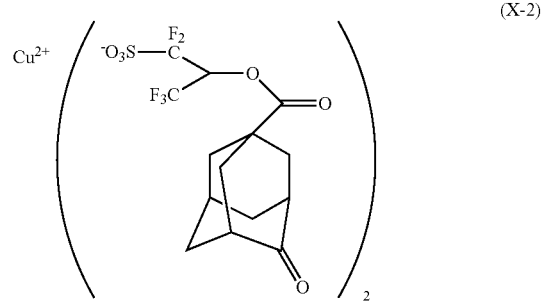

X-3: zinc(II) trifluoromethanesulfonate

X-4: compound represented by the following formula (X-4)

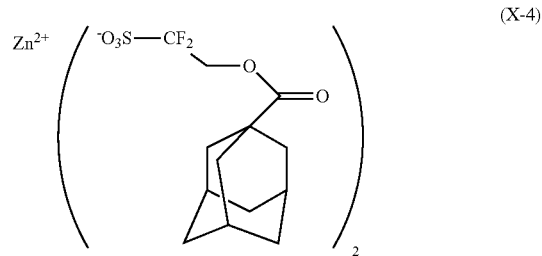

X-5: barium(II) nonafluorobutanesulfonate

X-6: compound represented by the following formula (X-6)

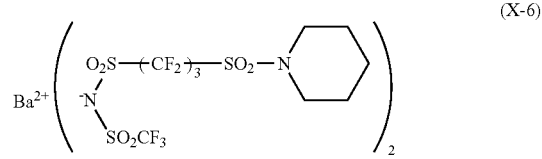

X-7: lanthanum(III) nitrate
X-8: compound represented by the following formula (X-8)

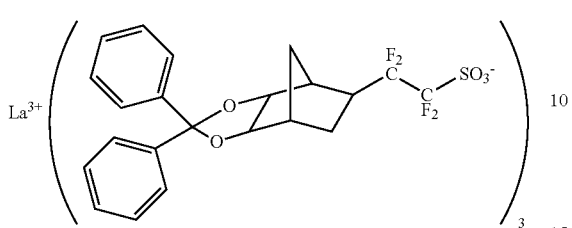

(X-8)

X-9: cerium(III) trifluoromethanesulfonate
X-10: cerium(III) 2-dodecylbenzenesulfonate
X-11: yttrium(III) trifluoromethanesulfonate
X-12: compound represented by the following formula (X-12)

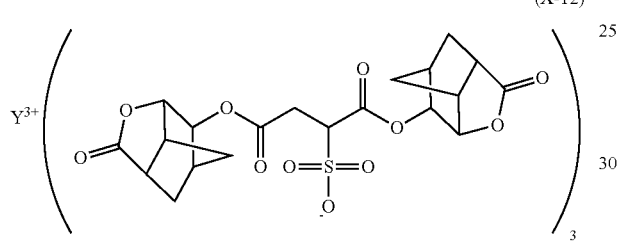

(X-12)

X-13: indium(III) trifluoromethanesulfonate
X-14: compound represented by the following formula (X-14)

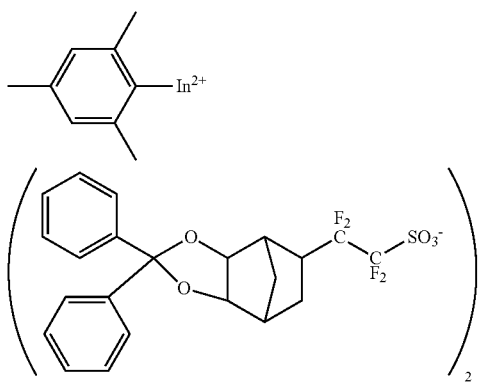

(X-14)

(D) Carboxylic Acid
D-1: methacrylic acid
(E) Solvent
E-1: propylene glycol monomethyl ether acetate
(Y) Radiation-Sensitive Acid Generating Agent
Y-1: N-trifluoromethanesulfonyloxy-5-norbornene-2,3-dicarboxyimide (compound represented by the following formula (Y-1))
Y-2: triphenylsulfonium nonafluoro-n-butane-1-sulfonate (compound represented by the following formula (Y-2))

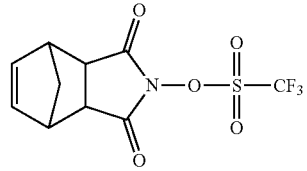

(Y-1)

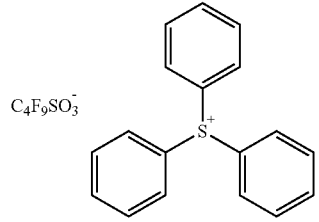

(Y-2)

Example 1

A radiation-sensitive composition (R-1) was prepared by blending 100 parts by mass of (A-1), 10 parts by mass of (X-1) as the metal salt (X), 10 parts by mass of (D-1) as the carboxylic acid (D), and 3,880 parts by mass of (E-1) as the solvent (E), and then filtering the resulting mixture through a membrane filter having a pore size of 0.2 μm.

Examples 2 to 20 and Comparative Examples 1 to 8

Radiation-sensitive compositions (R-2) to (R-20) and (CR-1) to (CR-8) were prepared by a similar operation to that of Example 1 except that the type and the content of each component used were as shown in Table 2 below. In Table 2, "-" indicates that the corresponding component was not used.

TABLE 2

| | Radiation-sensitive composition | (A) Particles | | (X) Metal salt | | (D) Carboxylic acid | | (E) Solvent | | (Y) Acid generating agent | |
|---|---|---|---|---|---|---|---|---|---|---|---|
| | | type | content (parts by mass) | type | content (parts by mass) | type | content (parts by mass) | type | content (parts by mass) | type | content (parts by mass) |
| Example 1 | R-1 | A-1 | 100 | X-1 | 10 | D-1 | 10 | E-1 | 3,880 | — | — |
| Example 2 | R-2 | A-2 | 100 | X-1 | 10 | D-1 | 10 | E-1 | 3,880 | — | — |

TABLE 2-continued

| | Radiation-sensitive composition | (A) Particles type | content (parts by mass) | (X) Metal salt type | content (parts by mass) | (D) Carboxylic acid type | content (parts by by mass) | (E) Solvent type | content (parts by mass) | (Y) Acid generating agent type | content (parts by mass) |
|---|---|---|---|---|---|---|---|---|---|---|---|
| Example 3 | R-3 | A-3 | 100 | X-1 | 10 | D-1 | 10 | E-1 | 3,880 | — | — |
| Example 4 | R-4 | A-4 | 100 | X-1 | 10 | D-1 | 10 | E-1 | 3,880 | — | — |
| Example 5 | R-5 | A-5 | 100 | X-1 | 10 | D-1 | 10 | E-1 | 3,880 | — | — |
| Example 6 | R-6 | A-6 | 100 | X-1 | 10 | D-1 | 10 | E-1 | 3,880 | — | — |
| Example 7 | R-7 | A-7 | 100 | X-1 | 10 | D-1 | 10 | E-1 | 3,880 | — | — |
| Example 8 | R-8 | A-1 | 100 | X-2 | 10 | D-1 | 10 | E-1 | 3,880 | — | — |
| Example 9 | R-9 | A-1 | 100 | X-3 | 10 | D-1 | 10 | E-1 | 3,880 | — | — |
| Example 10 | R-10 | A-1 | 100 | X-4 | 10 | D-1 | 10 | E-1 | 3,880 | — | — |
| Example 11 | R-11 | A-1 | 100 | X-5 | 10 | D-I | 10 | E-1 | 3,880 | — | — |
| Example 12 | R-12 | A-1 | 100 | X-6 | 10 | D-1 | 10 | E-1 | 3,880 | — | — |
| Example 13 | R-13 | A-1 | 100 | X-7 | 10 | D-1 | 10 | E-1 | 3,880 | — | — |
| Example 14 | R-14 | A-1 | 100 | X-8 | 10 | D-1 | 10 | E-1 | 3,880 | — | — |
| Example 15 | R-15 | A-1 | 100 | X-9 | 10 | D-1 | 10 | E-1 | 3,880 | — | — |
| Example 16 | R-16 | A-1 | 100 | X-10 | 10 | D-1 | 10 | E-1 | 3,880 | — | — |
| Example 17 | R-17 | A-1 | 100 | X-11 | 10 | D-1 | 10 | E-1 | 3,880 | — | — |
| Example 18 | R-18 | A-1 | 100 | X-12 | 10 | D-1 | 10 | E-1 | 3,880 | — | — |
| Example 19 | R-19 | A-1 | 100 | X-13 | 10 | D-1 | 10 | E-1 | 3,880 | — | — |
| Example 20 | R-20 | A-1 | 100 | X-14 | 10 | D-1 | 10 | E-1 | 3,880 | — | — |
| Comparative Example 1 | CR-1 | A-1 | 100 | — | — | D-1 | 10 | E-1 | 3,880 | Y-1 | 10 |
| Comparative Example 2 | CR-2 | A-2 | 100 | — | — | D-1 | 10 | E-1 | 3,880 | Y-1 | 10 |
| Comparative Example 3 | CR-3 | A-3 | 100 | — | — | D-1 | 10 | E-1 | 3,880 | Y-1 | 10 |
| Comparative Example 4 | CR-4 | A-4 | 100 | — | — | D-1 | 10 | E-1 | 3,880 | Y-1 | 10 |
| Comparative Example 5 | CR-5 | A-5 | 100 | — | — | D-1 | 10 | E-1 | 3,880 | Y-1 | 10 |
| Comparative Example 6 | CR-6 | A-6 | 100 | — | — | D-1 | 10 | E-1 | 3,880 | Y-1 | 10 |
| Comparative Example 7 | CR-7 | A-7 | 100 | — | — | D-1 | 10 | E-1 | 3,880 | Y-1 | 10 |
| Comparative Example 8 | CR-8 | A-1 | 100 | — | — | D-1 | 10 | E-1 | 3,880 | Y-2 | 10 |

Resist Pattern Formation

The radiation-sensitive composition prepared as described above was applied on the surface of an 8-inch silicon wafer by using a spin coater ("CLEAN TRACK ACT8", available from Tokyo Electron Limited), and PB was carried out at 90° C. for 60 sec. Thereafter, a film having an average thickness of 35 nm was formed through cooling at 23° C. for 30 sec. Next, this film was irradiated with an electron beam by using a simplified electron beam writer ("HL800D" available from Hitachi, Ltd.; output: 50 KeV, electric current density: 5.0 A/cm$^2$). Then, a development was carried out at 23° C. for 30 sec with 2-propanol as a developer solution for an organic development, followed by drying to form a negative-tone pattern.

Evaluations

According to the following procedures, the LWR performance and the sensitivity were evaluated on each of the radiation-sensitive compositions (Examples 21 to 41). The results of the evaluations are shown in Table 3. For the measurement of the pattern line-width, a scanning electron microscope ("S-9380", available from Hitachi High-Technologies Corporation) was used.

LWR Performance

The pattern formed as described above was observed from above by using the scanning electron microscope. The line width was measured at arbitrary 50 points in total, then a 3-Sigma value was determined from the distribution of the measurements, and the value was defined as "LWR performance (nm)". The smaller value indicates a better LWR performance. Each LWR performance value was compared to the value on the radiation-sensitive composition of "determination standard" shown in Table 3 below, and the LWR performance was evaluated to be: "favorable" when an improvement of no less than 10% was observed (the LWR performance value being no greater than 90%); "equivalent" when the difference was less than 10% (the LWR performance value being greater than 90% and less than 110%); and "unfavorable" when worsen by no less than 10% (the LWR performance value being no less than 110%).

Sensitivity

An exposure dose required for forming a line-and-space pattern of 150 nm was measured, and the measurement value was defined as "sensitivity (μC)". The smaller value indicates a better sensitivity. Each sensitivity value was compared to the value on the radiation-sensitive composition of "determination standard" shown in Table 3 below, and the sensitivity was evaluated to be: "favorable" when an improvement of no less than 10% was observed (the sensitivity value being no greater than 90%); "equivalent" when the difference was less than 10% (the sensitivity value being greater than 90% and less than 110%); and "unfavorable" when worsen by no less than 10% (the sensitivity value being less than 90% or no less than 110%).

TABLE 3

| | Radiation-sensitive composition | LWR performance | | Sensitivity | |
|---|---|---|---|---|---|
| | | determination standard | evaluation result | determination standard | evaluation result |
| Example 21 | R-1 | CR-1 | favorable | CR-1 | favorable |
| Example 22 | R-2 | CR-2 | favorable | CR-2 | favorable |
| Example 23 | R-3 | CR-3 | favorable | CR-3 | favorable |
| Example 24 | R-4 | CR-4 | favorable | CR-4 | favorable |
| Example 25 | R-5 | CR-5 | favorable | CR-5 | favorable |
| Example 26 | R-6 | CR-6 | favorable | CR-6 | favorable |
| Example 27 | R-7 | CR-7 | favorable | CR-7 | favorable |
| Example 28 | R-8 | CR-1 | favorable | CR-1 | favorable |
| Example 29 | R-9 | CR-1 | favorable | CR-1 | favorable |
| Example 30 | R-10 | CR-1 | favorable | CR-1 | favorable |
| Example 31 | R-11 | CR-1 | favorable | CR-1 | favorable |
| Example 32 | R-12 | CR-1 | favorable | CR-1 | favorable |
| Example 33 | R-13 | CR-1 | favorable | CR-1 | favorable |
| Example 34 | R-14 | CR-1 | favorable | CR-1 | favorable |
| Example 35 | R-15 | CR-1 | favorable | CR-1 | favorable |
| Example 36 | R-16 | CR-1 | favorable | CR-1 | favorable |
| Example 37 | R-17 | CR-1 | favorable | CR-1 | favorable |
| Example 38 | R-18 | CR-1 | favorable | CR-1 | favorable |
| Example 39 | R-19 | CR-1 | favorable | CR-1 | favorable |
| Example 40 | R-20 | CR-1 | favorable | CR-1 | favorable |
| Example 41 | R-1 | CR-8 | favorable | CR-8 | favorable |

As is clear from the results shown in Table 3, all the radiation-sensitive compositions of Examples were superior in the LWR performance and the sensitivity as compared to the radiation-sensitive compositions of Comparative Examples. It is to be noted that an EUV exposure is known to exhibit a similar tendency to the case of an electron beam exposure, and therefore, the radiation-sensitive compositions of Examples are expected to be superior in the LWR performance and the sensitivity, also in the case of the EUV exposure.

The radiation-sensitive composition and the pattern-forming method according to the embodiments of the present invention enable a pattern accompanied by less LWR to be formed with superior sensitivity. Therefore, these can be suitably used in manufacture of semiconductor devices in which further progress of miniaturization is expected in the future.

Obviously, numerous modifications and variations of the present invention are possible in light of the above teachings. It is therefore to be understood that within the scope of the appended claims, the invention may be practiced otherwise than as specifically described herein.

The invention claimed is:

1. A radiation-sensitive composition, comprising:
    particles comprising a metal oxide;
    a metal cation of $M^{n+}$ where M is a metal, and n is an integer of not less than 1; and
    an anion,
    wherein a content of the particles is no less than 50% by mass with respect to a total solid content of the radiation-sensitive composition, and the radiation-sensitive composition does not contain a radiation-sensitive acid generator.

2. The radiation-sensitive composition according to claim 1, wherein the anion is a conjugate base of an acid, and the acid has a pKa of no greater than 3.

3. The radiation-sensitive composition according to claim 2, wherein the acid is a sulfonic acid, a nitric acid, an organic azinic acid, a disulfonylimidic acid or a combination thereof.

4. The radiation-sensitive composition according to claim 2, wherein the content of the particles is in a range of 50% by mass to 99% by mass with respect to the total solid content of the radiation-sensitive composition.

5. The radiation-sensitive composition according to claim 1, wherein the content of the particles is in a range of 50% by mass to 99% by mass with respect to the total solid content of the radiation-sensitive composition.

6. The radiation-sensitive composition according to claim 5, wherein the content of the particles is no less than 70% by mass with respect to the total solid content of the radiation-sensitive composition.

7. The radiation-sensitive composition according to claim 1, wherein a hydrodynamic radius of the particles as determined by a dynamic light scattering analysis is no greater than 10 nm.

8. The radiation-sensitive composition according to claim 1, wherein a total content of the metal cation and the anion with respect to 100 parts by mass of the particles is no less than 5 parts by mass.

9. The radiation-sensitive composition according to claim 1, wherein a content of the metal cation is in a range of 0.1 parts by mass to 30 parts by mass with respect to 100 parts by mass of the particle.

10. The radiation-sensitive composition according to claim 1, wherein a content of the metal cation is in a range of 0.5 parts by mass to 20 parts by mass with respect to 100 parts by mass of the particle.

11. The radiation-sensitive composition according to claim 1, wherein the metal cation is a cation of zinc, barium, lanthanum, yttrium, or indium.

12. The radiation-sensitive composition according to claim 1, wherein a metal salt comprises the metal cation and the anion.

13. A pattern-forming method, comprising:
    applying the radiation-sensitive composition of claim 1 directly or indirectly on an upper face side of a substrate such that a film comprising the radiation-sensitive composition is formed on the substrate;
    exposing the film comprising the radiation-sensitive composition to a radioactive ray; and
    developing the film with a developer solution after the exposing of the film to the radioactive ray.

14. The pattern-forming method according to claim 13, wherein the developer solution in the developing is an alkaline aqueous solution.

15. The pattern-forming method according to claim 13, wherein the developer solution in the developing is an organic solvent-containing liquid.

16. The pattern-forming method according to claim 13, wherein the radioactive ray in the exposing is an extreme ultraviolet ray or an electron beam.

17. The radiation-sensitive composition according to claim 1, wherein the anion is a conjugate base of an acid, and the acid has a pKa in a range of 3 to −8.

18. The radiation-sensitive composition according to claim 1, wherein the anion is a conjugate base of an acid, and the acid has a pKa in a range of 2 to −6.

19. The radiation-sensitive composition according to claim 1, wherein a hydrodynamic radius of the particles as determined by a dynamic light scattering analysis is no greater than 10 nm, and a total content of the metal cation and the anion with respect to 100 parts by mass of the particles is no less than 5 parts by mass.

20. The radiation-sensitive composition according to claim 1, wherein a hydrodynamic radius of the particles as determined by a dynamic light scattering analysis is no greater than 10 nm, a content of the metal cation is in a range of 0.1 parts by mass to 30 parts by mass with respect to 100 parts by mass of the particle, and a total content of the metal cation and the anion with respect to 100 parts by mass of the particles is no less than 5 parts by mass.

\* \* \* \* \*